(12) United States Patent
Yang et al.

(10) Patent No.: US 7,169,668 B2
(45) Date of Patent: Jan. 30, 2007

(54) METHOD OF MANUFACTURING A SPLIT-GATE FLASH MEMORY DEVICE

(75) Inventors: Ming-Tzong Yang, Hsin-Chu (TW);
Tzu-Ping Chen, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 25 days.

(21) Appl. No.: 10/905,535

(22) Filed: Jan. 9, 2005

(65) Prior Publication Data
US 2006/0154424 A1 Jul. 13, 2006

(51) Int. Cl.
*H01L 21/336* (2006.01)
(52) U.S. Cl. .................................... 438/257
(58) Field of Classification Search ............... 438/286, 438/257; 257/390
See application file for complete search history.

(56) References Cited

U.S. PATENT DOCUMENTS 5,705,439 A * 1/1998 Chang ..................... 438/286
6,674,132 B2 * 1/2004 Willer ..................... 257/390

* cited by examiner

*Primary Examiner*—Carl Whitehead, Jr.
*Assistant Examiner*—Monica D. Harrison
(74) *Attorney, Agent, or Firm*—Winston Hsu

(57) ABSTRACT

A method of manufacturing a split-gate flash memory device is disclosed. On a semiconductor substrate having a plurality of parallel conductive lines, a plurality of doped regions are formed by an ion implantation using the conductive lines as mask. Then, the conductive lines are trimmed for thinning the cover area. Afterward, a composite dielectric layer is formed on the substrate and covers the conductive lines. Finally, a plurality of word lines are formed on the composite dielectric layer.

20 Claims, 25 Drawing Sheets on the top silicon oxide layer 28.

METHOD OF MANUFACTURING A SPLIT-GATE FLASH MEMORY DEVICE

BACKGROUND OF INVENTION

1. Field of the Invention

The present invention relates to a method of forming a nonvolatile memory, and more particularly, to a method of forming a split-gate flash memory.

2. Description of the Prior Art

Nonvolatile memories have the advantages of maintaining stored data while the power supply is interrupted, and thus have been widely employed in recent years. According to the bit numbers stored by a single memory cell, nonvolatile memories are divided into single-bit storage nonvolatile memories, including nitride-based non-volatile memories such as Nitride Read-Only-Memory (NROM), Metal-Oxide-Nitride-Oxide-Silicon (MONOS) memories or Silicon-Oxide-Nitride-Oxide-Silicon (SONOS) memories, and dual-bit storage nonvolatile memories, such as split-gate SONOS memories and split-gate MONOS memories. Comparing to the traditional single-bit storage memories, the split-gate SONOS memories and split-gate MONOS memories are capable of storing more data, and thus have gradually become more and more popular in the memory device market.

Please refer to FIG. 1 and FIG. 2. FIG. 1 and FIG. 2 are schematic diagrams of a split-gate SONOS memory 10, where FIG. 1 illustrates the split-gate SONOS memory 10 during a programming operation, and FIG. 2 illustrates the split-gate SONOS memory 10 during an erasing operation. It is appreciated that only a single memory cell is illustrated in FIG. 1 and FIG. 2 for clearly demonstrating the structure and operational theorem of the split-gate SONOS memory 10. As shown in FIG. 1, the split-gate SONOS memory 10 is formed on a P well 12, which includes a select gate 14, and two N buried bit lines, respectively serving as a source 16 and a drain 18, positioned on the opposite sides of the P well 12. The split-gate SONOS memory 10 further includes a gate insulating layer 20 between the select gate 14 and the P well 12, and a cap layer 22 above the select gate 14. In addition, the split-gate SONOS memory 10 further includes a bottom silicon oxide layer 24, a silicon nitride layer 26, and a top silicon oxide layer 28 on the select gate 14 and the P well 12. The silicon nitride layer 26 works as a storage medium for trapping electrons or hot holes. Furthermore, the split-gate SONOS memory 10 has a word line 30 positioned on the top silicon oxide layer 28.

As shown in FIG. 1, the split-gate SONOS memory 10 is programmed by a source-side injection mechanism. The voltage operations are as follows: the world line 30 is applied with a high positive voltage (e.g. 6 to 9V); the select gate 14 is applied with a low positive voltage (e.g. 1V); the source 18 is applied with a positive voltage (e.g. 4.5V); and the P well 12 and the drain 16 are maintained at 0V. Under these voltage operations, electrons which traverse the channel underneath the select gate 14 will be captured and trapped in the silicon nitride layer 26 close to the source 18 (as the arrow marks show in FIG. 1) to store a bit of data. In addition, under similar inverse voltage operations, electrons can be trapped in the silicon nitride layer 26 close to the drain 16 to store another bit of data.

As shown in FIG. 2, the split-gate SONOS memory 10 is erased by a band-to-band hot hole injection mechanism. The voltage operations are as follows: the world line 30 is applied with a high negative voltage (e.g. −6 to −9V); the source 18 is applied with a positive voltage (e.g. 4.5V); the select gate 14 is maintained at a level lower than the threshold voltage, and the P well 12 and the drain 16 are maintained at 0V. Under these voltage operations, hot holes in the P well 12 will inject to the silicon nitride layer 26 close to the source 18, and neutralize the electrons trapped in the silicon nitride layer 26. Similarly, the electrons trapped in the silicon nitride layer 26 close to the drain 16 can be neutralized under similar inverse voltage operations.

Please refer to FIG. 3 to FIG. 6. FIG. 3 to FIG. 6 are schematic diagrams illustrating a conventional method of forming a split-gate SONOS memory. For easy illustration, only parts of memory cells are shown. As shown in FIG. 3, a substrate 50 including a P well 52 is formed, and a plurality of select gate structures 54 are positioned on the P well 52. Each select gate structure 54 from bottom to top includes a gate insulating layer 56, a select gate 58, and a cap layer 60. The gate insulating layer 56 is a silicon oxide layer formed by a thermal oxidization process or a deposition process, the select gate 58 is a polysilicon layer, and the cap layer 60 is a silicon nitride layer or a polycide.

As shown in FIG. 4, a composite dielectric layer (ONO tri-layer dielectric) 62 including a bottom silicon oxide layer 64, a silicon nitride layer 66, and a top silicon oxide layer 68 are formed on the substrate 50 and the select gate structures 54. Thereafter, a silicon oxide layer 70 is deposited as sacrificial spacers to be formed later.

As shown in FIG. 5, an etching back process is performed to entirely etch back the silicon oxide layer 70 for forming sacrificial spacers 72 alongside each select gate structure 54. The etching back process is not stopped until the composite dielectric layer 62 is open so as to form an opening 74 between any two adjacent sacrificial spacers 72. Thereafter, an implantation process is performed to form a plurality of N doped regions 76, which serve as buried bit lines, in the P well 52 via the openings 74. Afterward, an insulating layer (not shown) is entirely deposited on the top silicon oxide layer 68 and on the N doped regions 76, and an etching back process is performed to form a blocking film 78 on each N doped region 76.

As shown in FIG. 6, an etching process is then performed to remove the sacrificial spacers 72. A polysilicon layer 80 is totally deposited, and a photolithography and etching process is performed to define word lines 80.

As described, the process for forming the N doped regions 76 is performed after forming the composite dielectric layer 62 according to the conventional method. In other words, the composite dielectric layer 62 between any two adjacent sacrificial spacers 72 must be removed before forming the N doped regions 76. In addition, the blocking film 78 has to be formed before forming the word lines 80, or alternatively another silicon oxide layer (not shown) has to be formed after removing the sacrificial spacers 76 to avoid short circuits between the word lines 80 and the N doped regions (buried bit lines) 76. It is appreciated that even though the short circuit problem is avoided by forming the blocking film 78, other factors, such as the incompletion of the composite dielectric layer 62, the remaining etching stress, and the etching infirmity, may cause damage to the split-gate SONOS memory. For example, a higher voltage difference between the word lines and the buried bit lines may be necessary when performing the erasing operation, or a current leakage problem may occur. This leads to tunneling between the word lines and the buried bit lines, and reduces the reliability of split-gate SONOS memory.

Therefore, the manufacturing process for split-gate flash memories still needs improvement to enhance the reliability of split-gate flash memory and the yield for production.

SUMMARY OF INVENTION

It is therefore an objective of the present invention to provide a method of forming a split-gate flash memory to overcome the problems of the conventional method and enhance the reliability and the yield.

According to the present invention, a method of forming a split-gate flash memory is provided. First, a semiconductor substrate having a plurality of conductive lines arranged in parallel thereon is provided. Then, an implantation process by utilizing the conductive lines as a mask is performed to form a doped region in the semiconductor substrate between two adjacent conductive lines. Thereafter, a trimming process is performed to trim a shielding area of each conductive line. A composite dielectric layer is then formed on the semiconductor substrate and covers the conductive lines. Finally, a plurality of word lines on the composite dielectric layer perpendicular to the conductive lines are formed.

In another aspect according to the present invention, a method of forming a split-gate flash memory is provided. First, a semiconductor substrate having a gate insulating layer, a conductive layer, and a dielectric layer formed in the order of bottom to top on the semiconductor substrate is provided. Then, the dielectric layer is etched so that the dielectric layer forms a plurality of parallel three-dimensional strip structures. Thereafter, a first spacer respectively positioned on the opposite side walls of the three-dimensional strip structures is performed. Part of the conductive layer not covered by the three-dimensional strip structures and the first spacers are etched to expose part of the gate insulating layer. Then, an implantation process by utilizing the three-dimensional strip structures and the first spacers as a mask is performed to form a plurality of doped regions in the semiconductor substrate. Subsequently, the first spacers are removed. Part of the conductive layer not covered by three-dimensional strip structures is etched to form a plurality of select gate structures. A composite dielectric layer is then formed on the semiconductor substrate and covers the three-dimensional strip structures and the select gate structure. Finally, a plurality of word lines on the composite dielectric layer perpendicular to the conductive lines are formed.

The flash memories produced using the method of the present invention have high reliability and yield. In addition, the doping process for the doping area is performed by utilizing the configurations of the dielectric layer which may be a photoresist layer or other film and the gate structures formed during the formation. Furthermore, the select gate is defined by the dielectric layer trimming process and utilizing the high etching selectivity of polysilicon to oxide. Therefore, the method of the present invention is also relatively simple and convenient.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
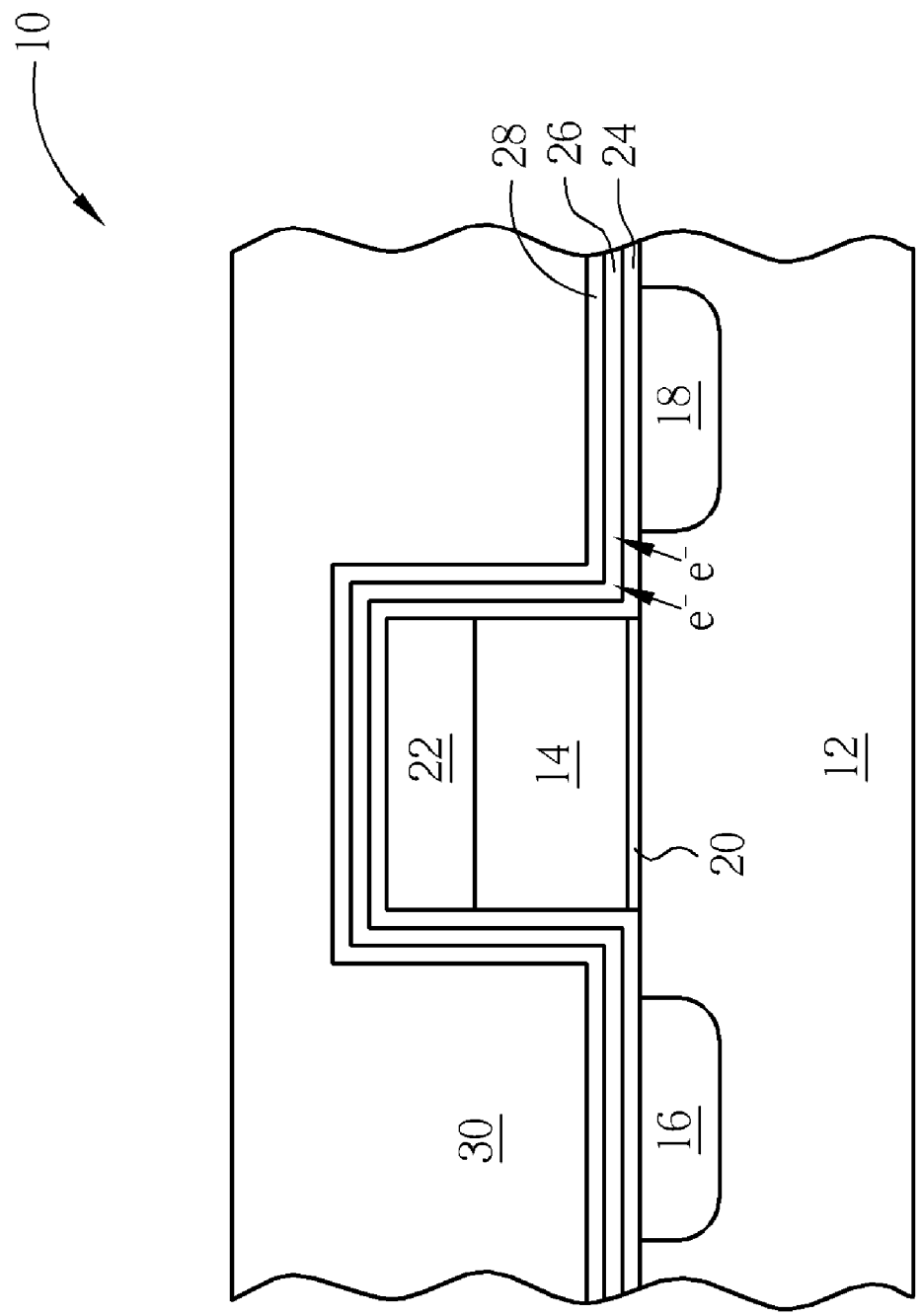
FIG. 1 and FIG. 2 are schematic diagrams of a conventional split-gate SONOS memory.
Figure 2:
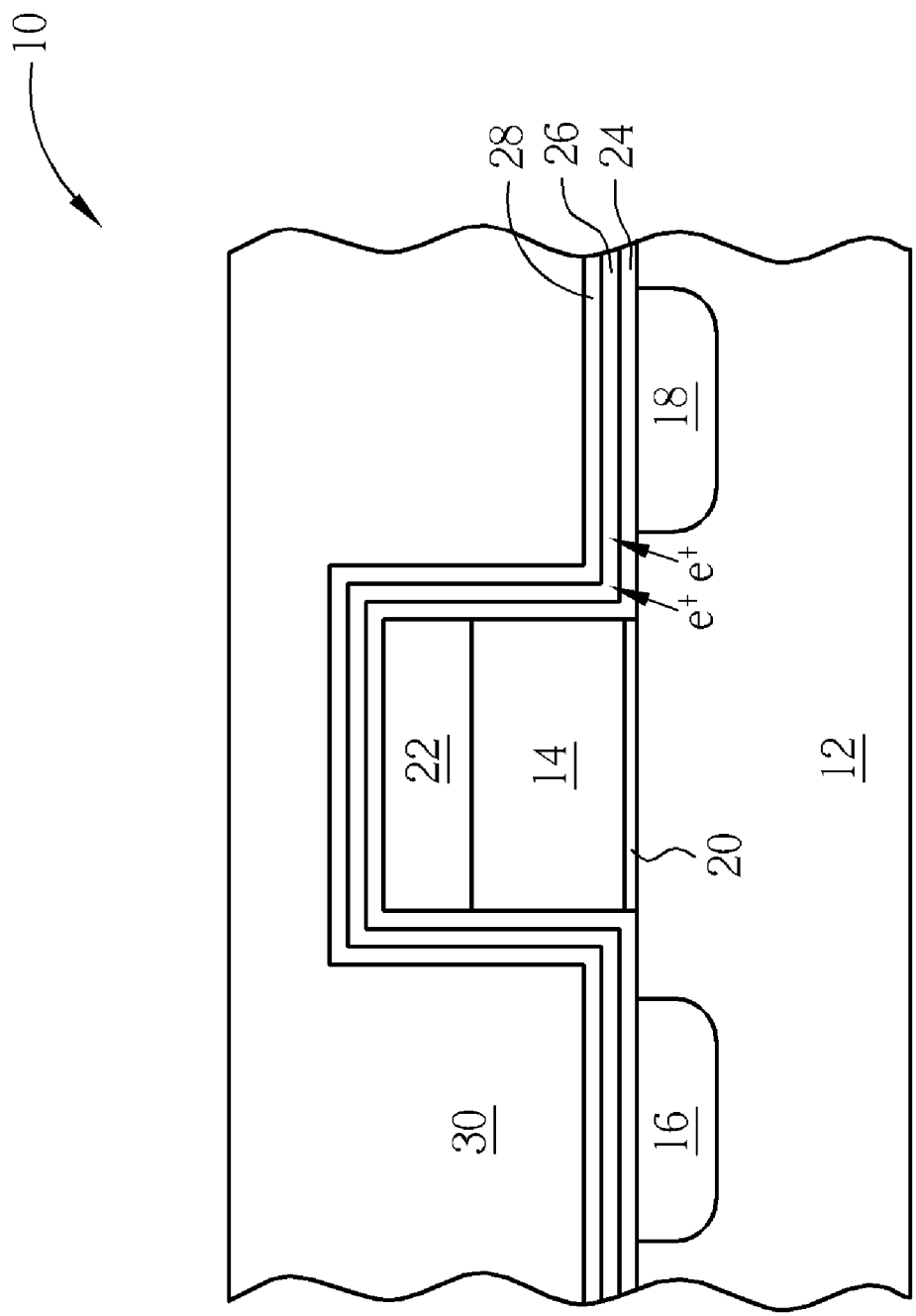
Figure 3:
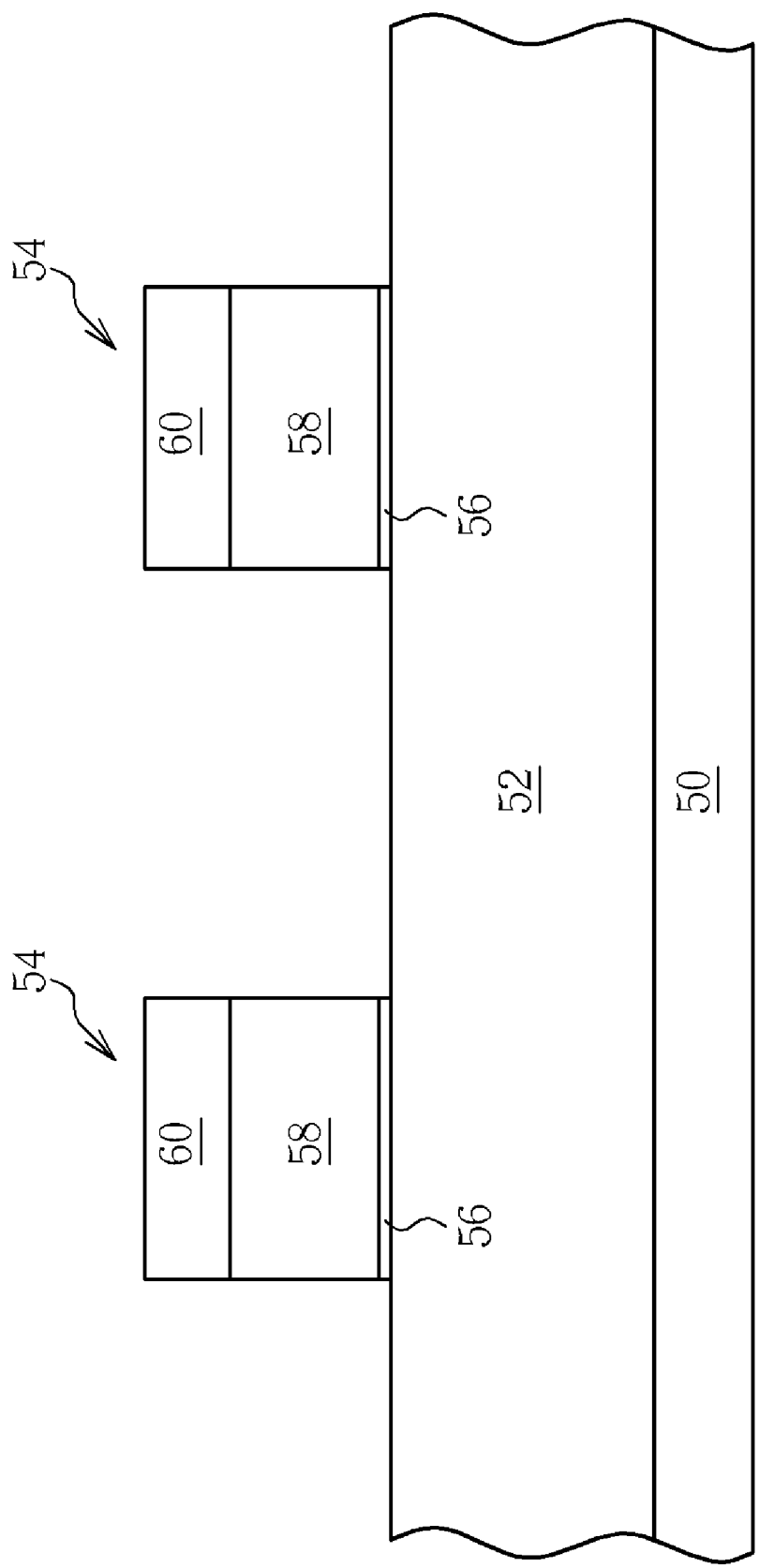
FIG. 3 to FIG. 6 are schematic diagrams illustrating a conventional method of forming a split-gate SONOS memory.
Figure 4:
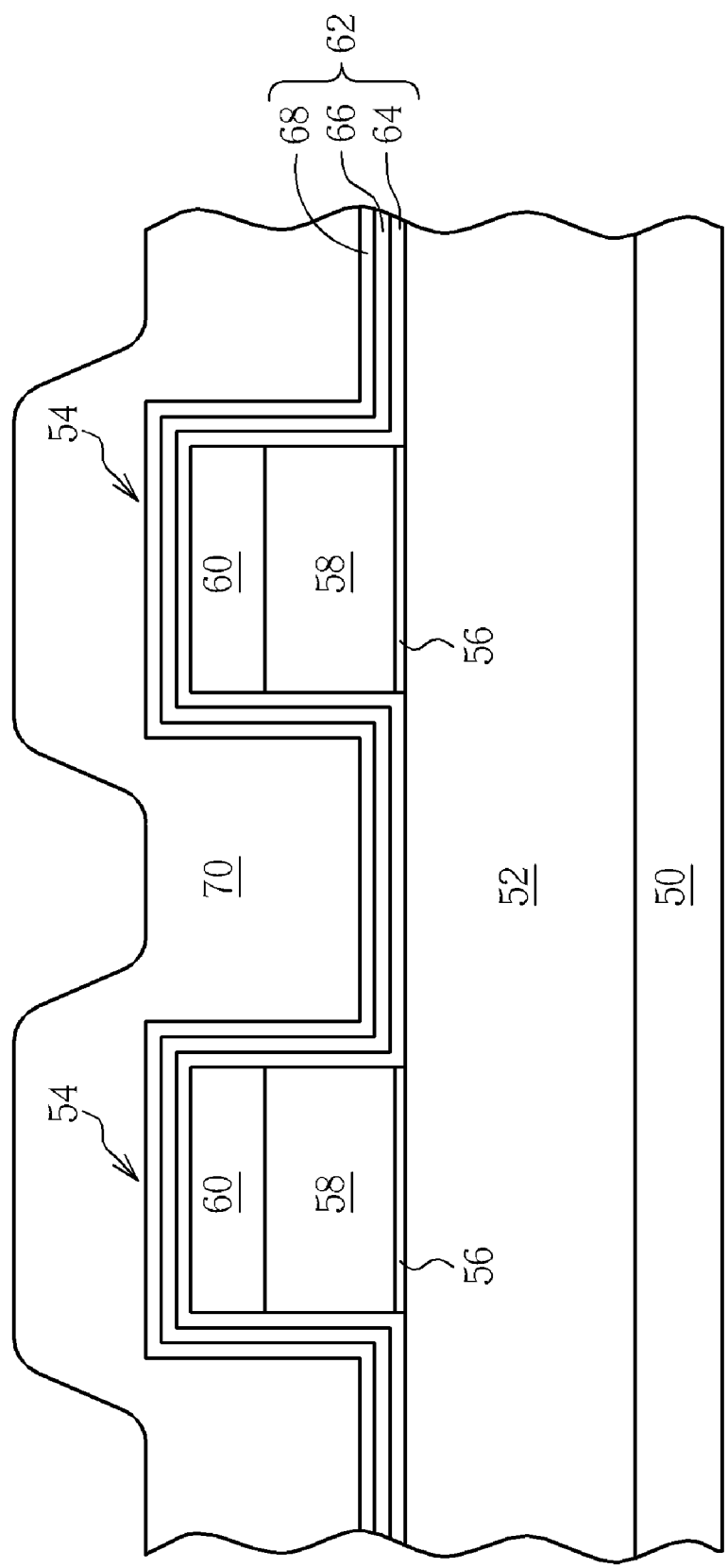
Figure 5:
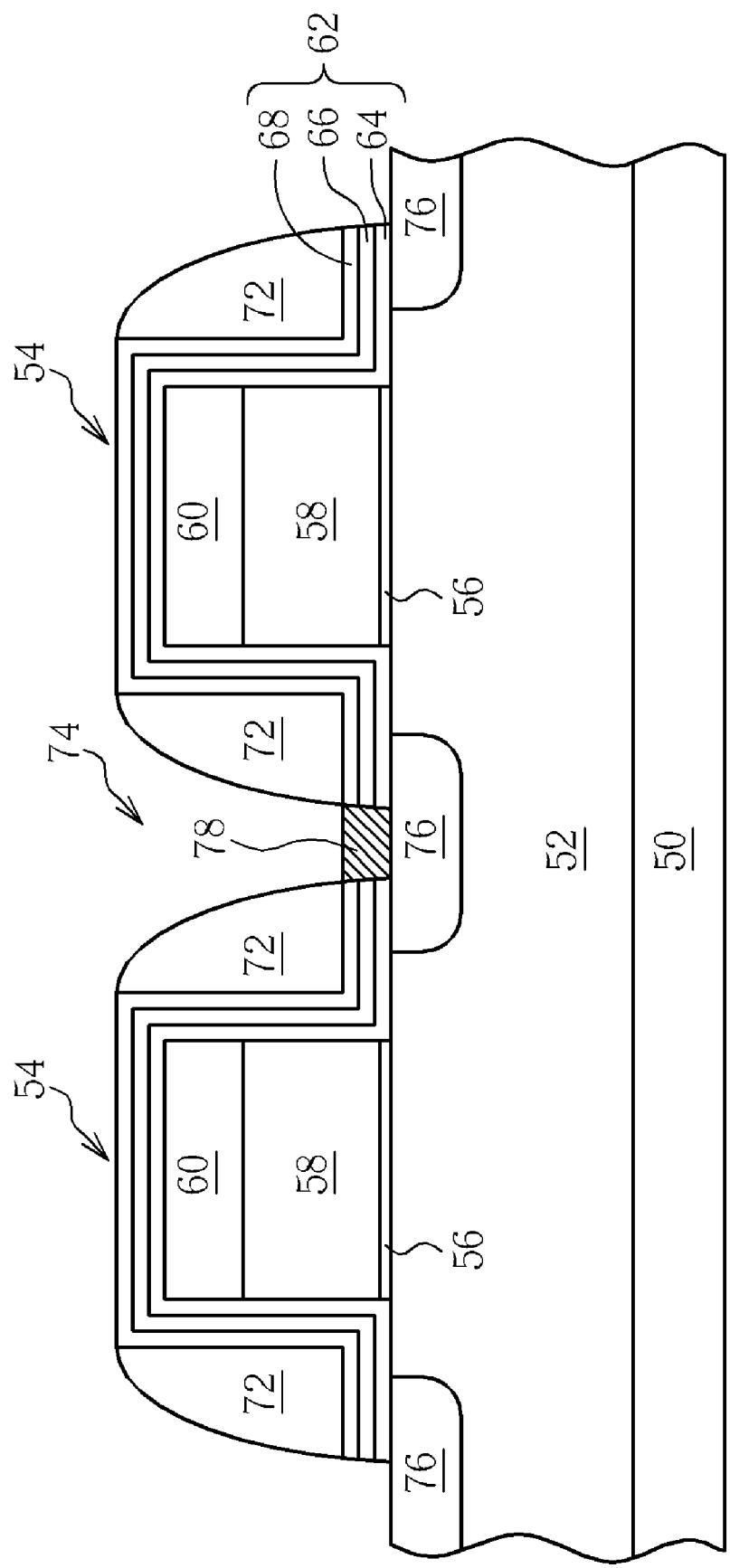
Figure 6:
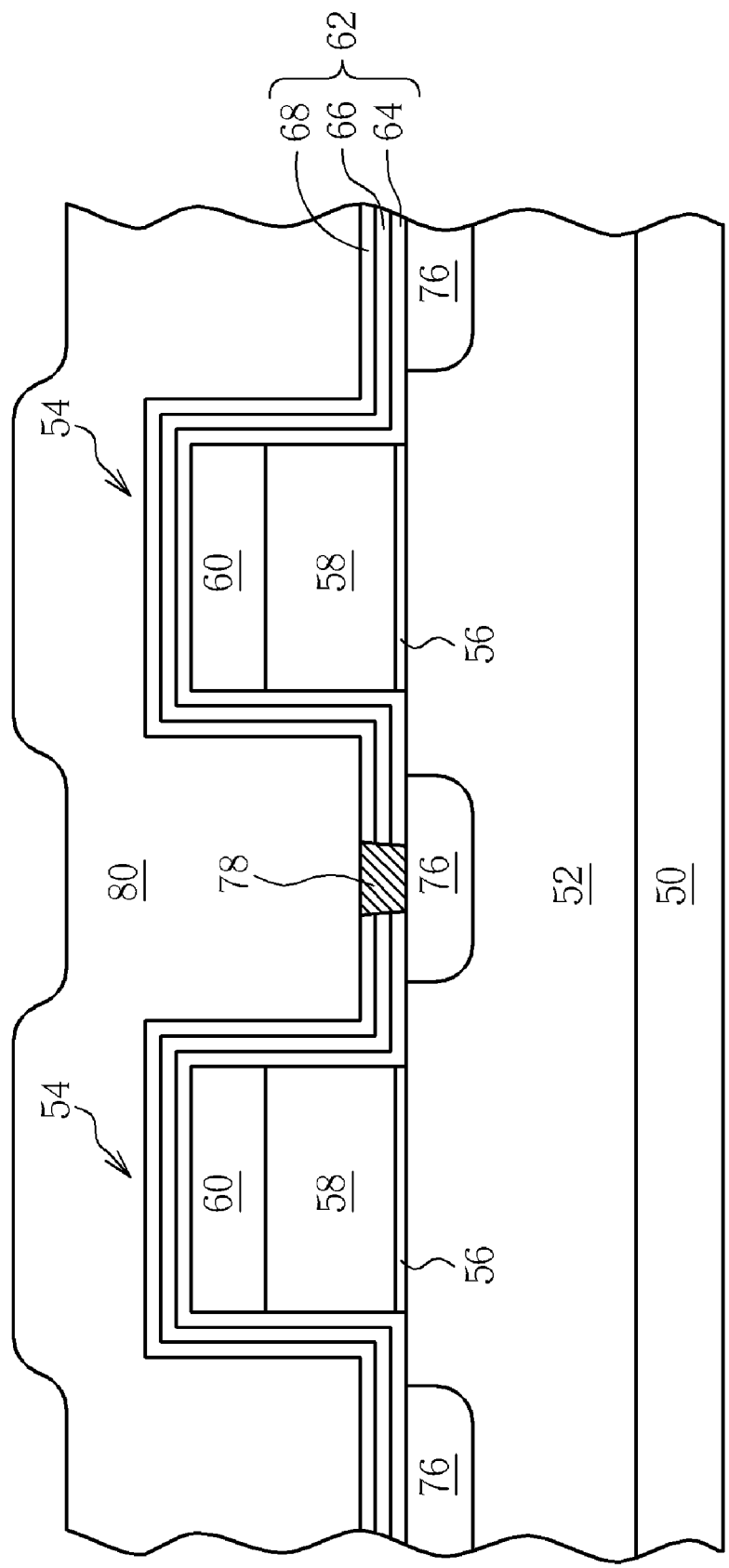
Figure 7:
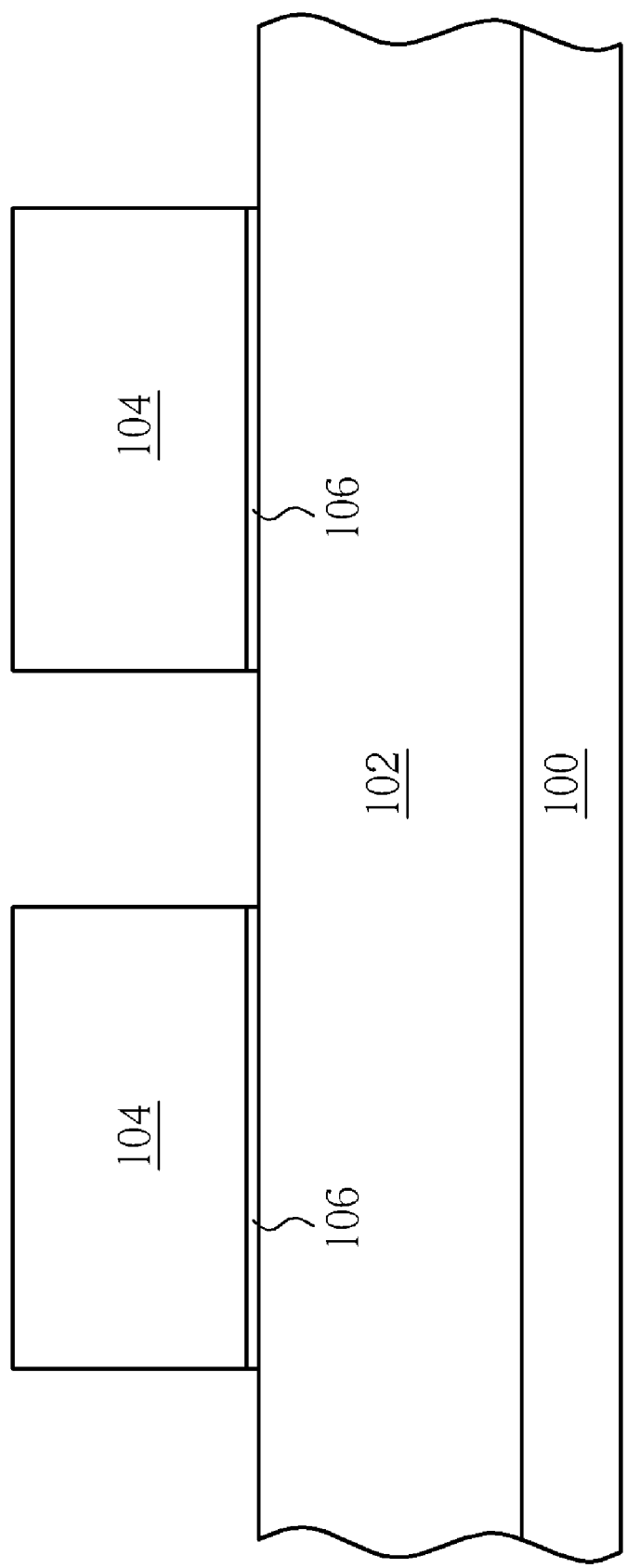
FIG. 7 to FIG. 10 are schematic diagrams illustrating a method of forming a split-gate memory according to an embodiment of the present invention.

Please refer to FIG. 7 to FIG. 10. FIG. 7 to FIG. 10 are schematic diagrams illustrating a method of forming a split-gate flash memory according to a preferred embodiment of the present invention. It is to be appreciated that for emphasizing the defining characteristic of the present invention, FIG. 7 to FIG. 10 are cross-sectional views of some memory cells. As shown in FIG. 7, a semiconductor substrate 100 is provided, and at least a P well 102 is formed in the semiconductor substrate 100. The semiconductor substrate may be a P-type semiconductor substrate. Then, a polysilicon layer (not shown) serving as a conductive layer is formed on the semiconductor substrate 100 and patterned to form a plurality of parallel conductive lines 104. A gate insulating layer 106, such as an oxide layer, may be formed between the conductive lines 104 and the semiconductor substrate 100. The gate insulating layer 106 is a silicon oxide layer prepared by a thermal oxidation process or a deposition process. The conductive lines 104 may be polysilicon or other conductive material, such as metal.

Figure 8:
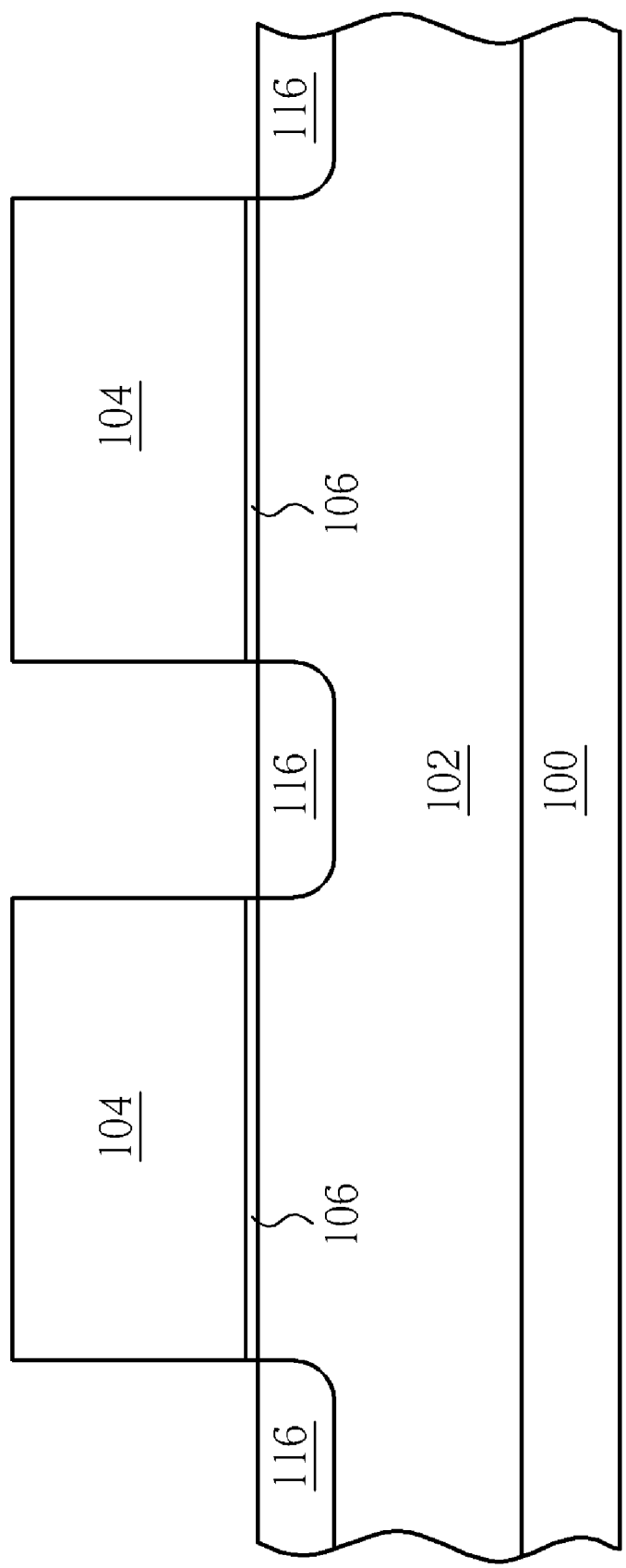

As shown in FIG. 8, an ion implantation process is performed using the conductive lines 104 as a mask to form a doped region 116, serving as a buried bit line, in the semiconductor substrate between two adjacent conductive lines. In addition, a drive-in process is alternatively performed to diffuse the dopants in the N doped regions. It is to be appreciated that this embodiment illustrates the method of forming an NMOS type split-gate SONOS memory, and therefore P well 102 and N doped regions 116 are formed in the substrate 100. If a PMOS type split-gate SONOS memory is to be fabricated, then different dopants must be utilized to form an N well and P doped regions.

Figure 9:
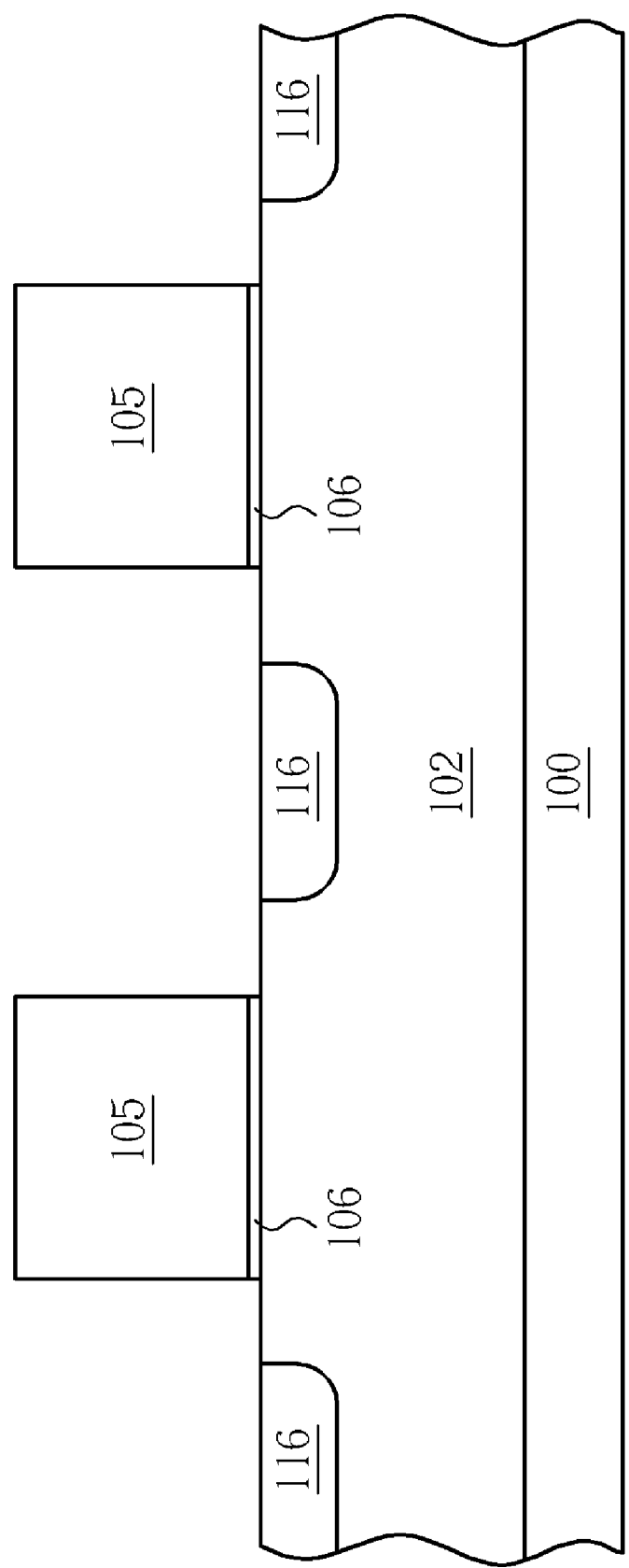

As shown in FIG. 9, a trimming process for the conductive lines 104 is performed to reduce the shielding area of the conductive lines on the semiconductor substrate 100. The trimming process may be an isotropic etching process, such as a wet etching process or a dry etching process, resulting in a uniform trimming. For example, if the conductive line comprises polysilicon, a mixed solution containing hydrofluoric acid and nitric acid or a solution containing KOH can be used as an etching solution for the wet etching process. The conductive lines 104 after the trimming serve as select gate structure 105.

Figure 10:
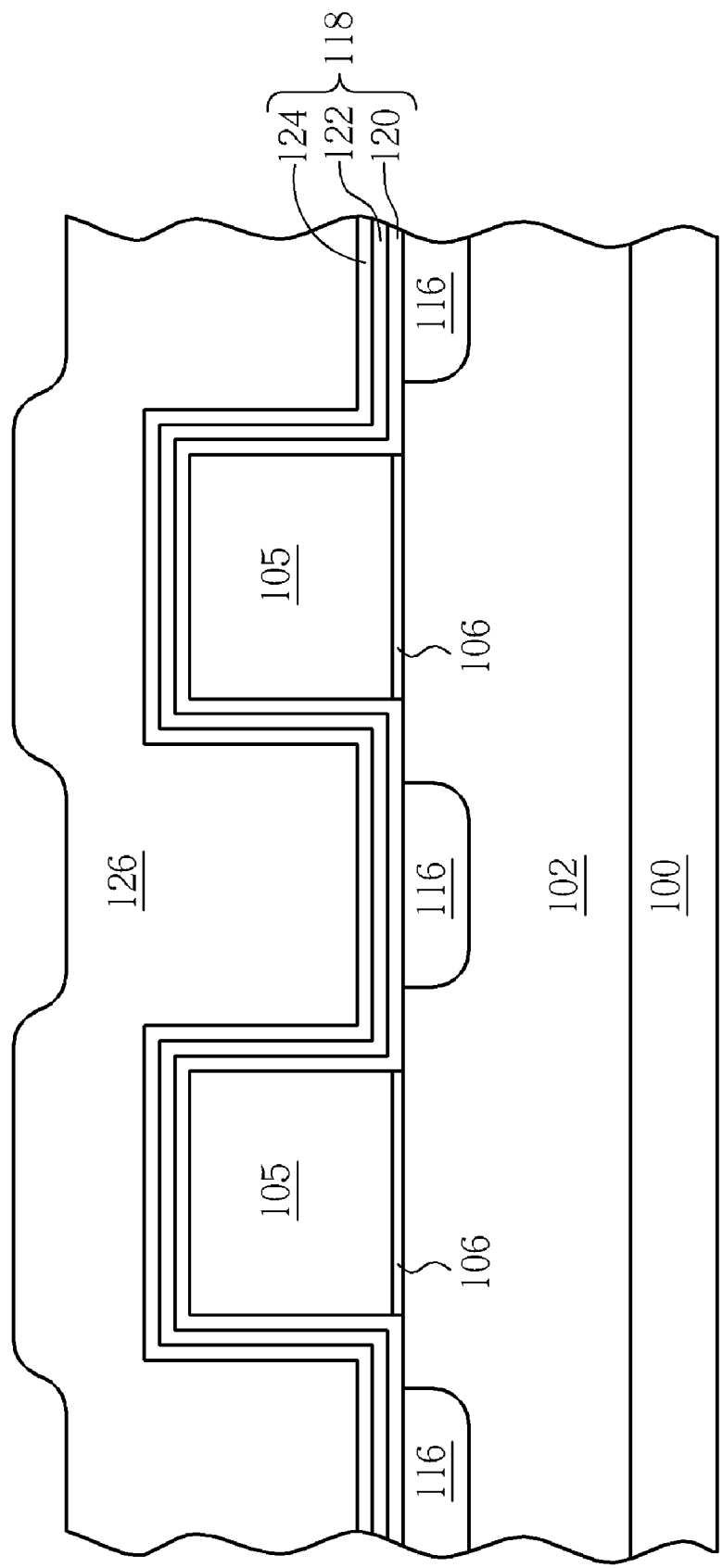

As shown in FIG. 10, a composite dielectric layer 118 is formed on the semiconductor substrate 100, the select gate structure 105, and the N doped regions 116 for being a storage medium of electrons. In this embodiment, the composite dielectric layer 118 is a silicon oxide-silicon nitride-silicon oxide (ONO) tri-layer dielectric including a bottom silicon oxide layer 120, a silicon nitride layer 122, and a top silicon oxide layer 124. Other examples of the composite dielectric layer include an oxide/nitride bi-layer dielectric, a nitride/oxide bi-layer dielectric, an oxide/tantalum oxide bi-layer dielectric ($SiO_2/Ta_2O_5$), an oxide/tantalum oxide/oxide tri-layer dielectric ($SiO_2/Ta_2O_5/SiO_2$), an oxide/strontium titanate bi-layer dielectric ($SiO_2/SrTiO_3$), an oxide/barium strontium titanate bi-layer dielectric ($SiO_2/BaSrTiO_2$), an oxide/strontium titanate/oxide tri-layer dielectric ($SiO_2/SrTiO_3/SiO_2$), an oxide/strontium titanate/barium strontium titanate tri-layer dielectric ($SiO_2/SrTiO_3/BaSrTiO_2$), an oxide/hafnium oxide/oxide tri-layer dielectric ($SiO_2/Hf_2O_5/SiO_2$), and the like (in each case, the first layer mentioned is the bottom layer while the last layer mentioned is the top layer). Finally, a conductive layer (not shown), such as a polysilicon layer, a metal layer, or a polycide, is entirely deposited on the composite dielectric layer 118, and a photolithography and etching process is performed to define a plurality of parallel word lines 126, which are perpendicular to the select gate structures 105.

Figure 11:
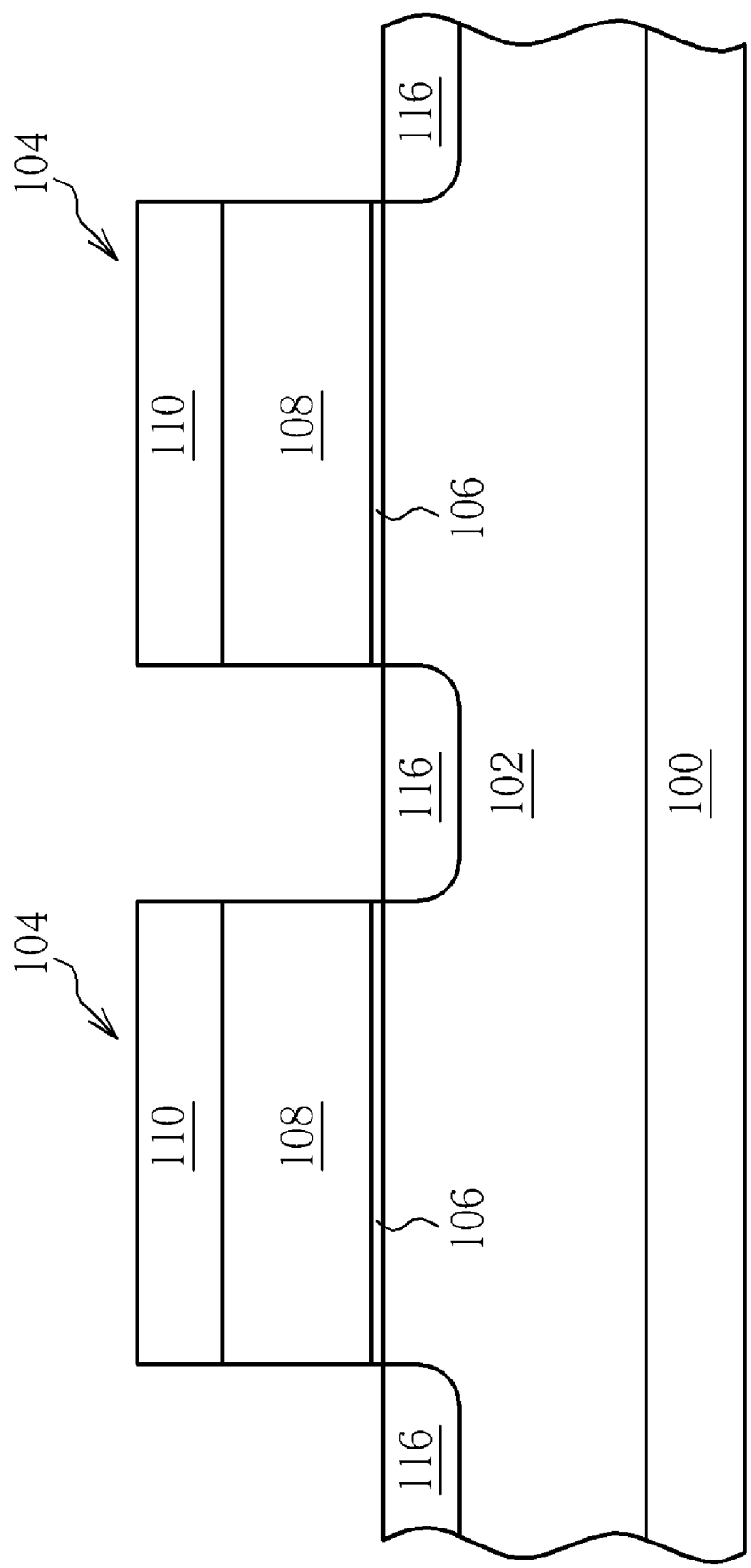
FIG. 11 to FIG. 13 are schematic diagrams illustrating a method of forming a split-gate memory according to another embodiment of the present invention.
Figure 12:
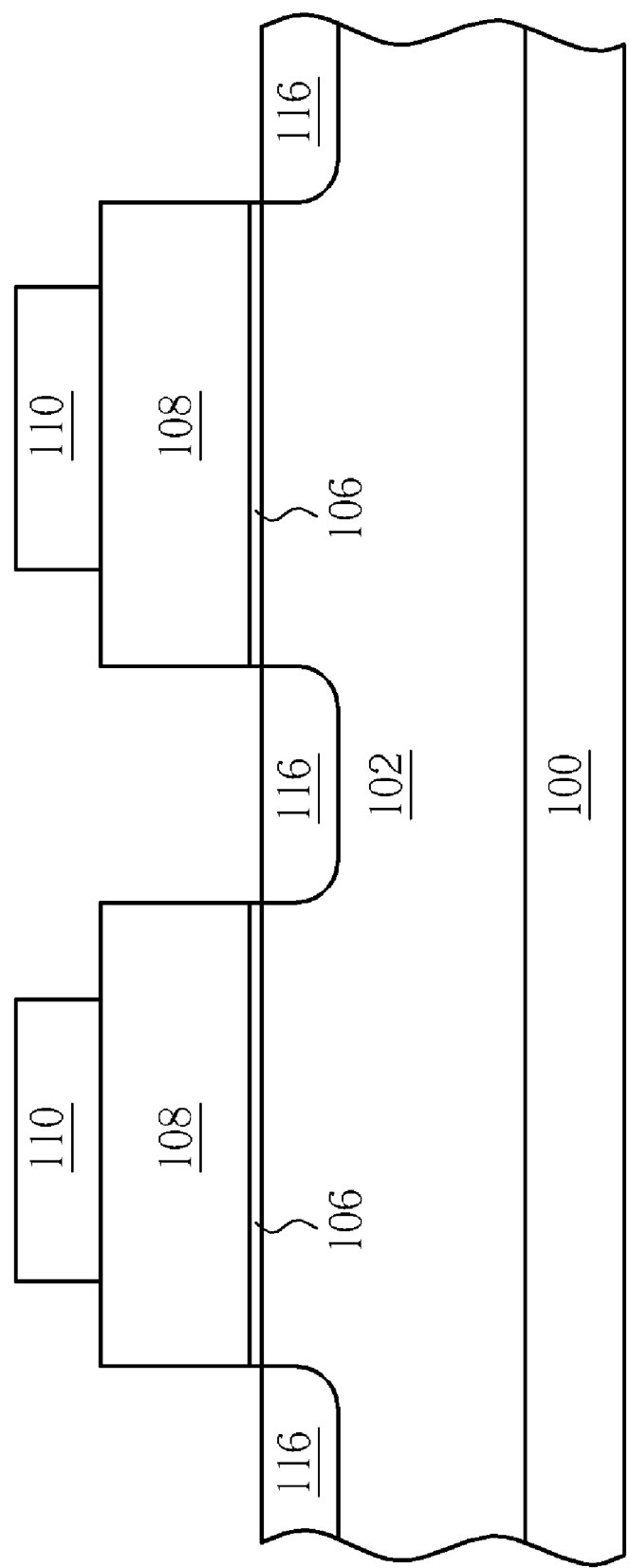
Figure 13:
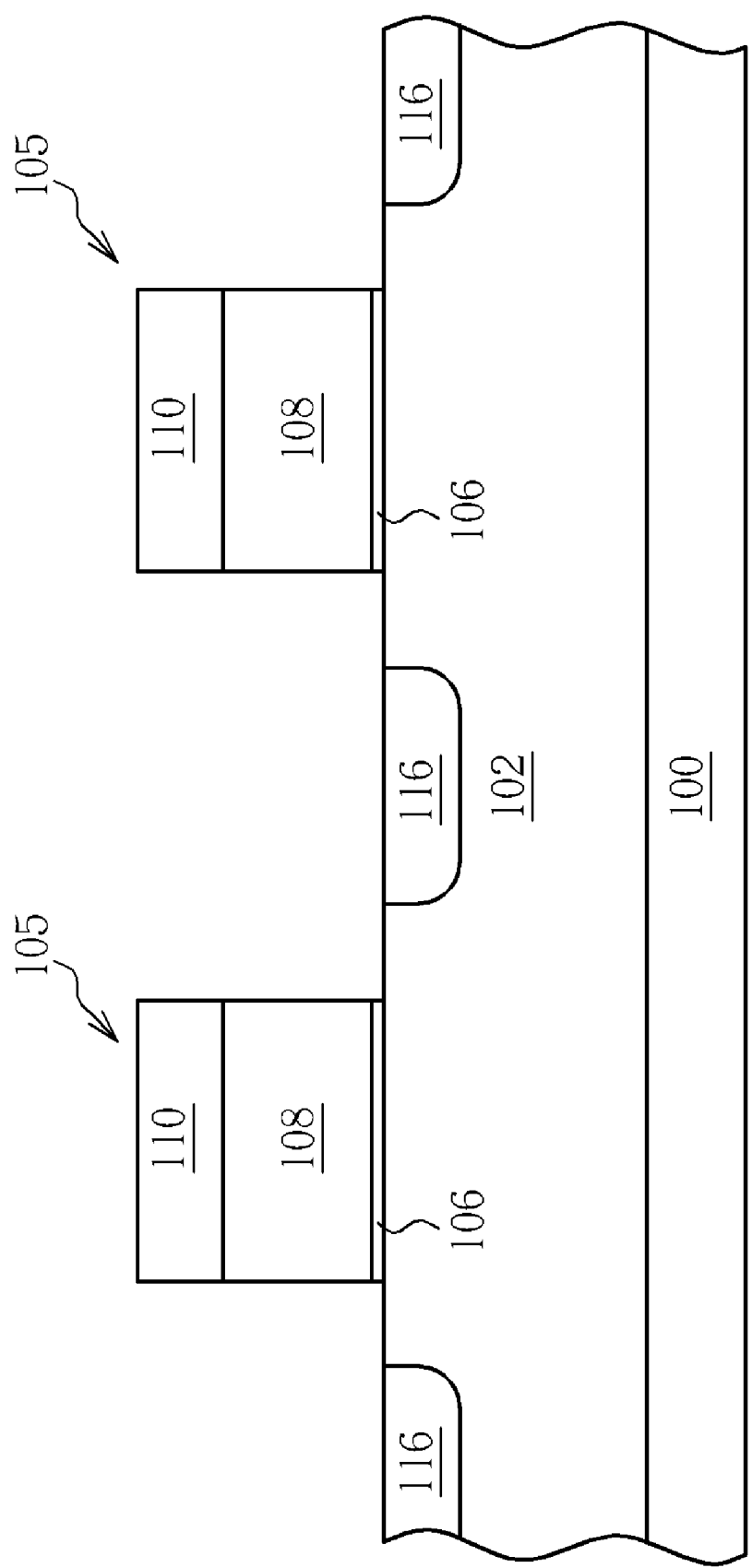

It is to be noted that the conductive lines 104 may comprise a polysilicon layer 108 and a cap layer 110, as shown in FIG. 11. The cap layer 110 may be a layer of photoresist, dielectric material, or conductive material. In such case, the conductive lines 104 are utilized as a mask for the ion implantation to form the doped regions 116 in the semiconductor substrate between two adjacent conductive lines. Then, a trimming process is performed, as shown in FIG. 12 and FIG. 13. The process for trimming the conductive lines 140 may be performed so that the cap layers 110 and the polysilicon layers 108 are trimmed simultaneously or in order, that is, the cap layer 110 is trimmed firstly and then the polysilicon layer 108 is trimmed, depending on the properties of these two layers. In the embodiment of the present invention, the cap layer 110 is a photoresist layer. A PR-trimming process is performed by a plasma etching process using $C_2H_6$, oxygen gas, and helium as a reactive gas or by heating at a high temperature to decompose the surface layer of the photoresist layer, to uniformly trim the size of the photoresist layer, especially the shielding area covering the underlying polysilicon layers. Then, an anisotropically etching process, such as a dry etching process, is performed using the cap layers 110 which have been etched to trim the size as a mask to removing part of the polysilicon layer 108 not covered by the cap layer 110. The conductive lines 104 after the trimming process serve as select gate structures 105. Thereafter, in the case that the cap layer 110 is a photoresist layer, a stripping process is needed to remove the photoresist layer. Subsequently, a composite dielectric layer 118 and word lines 126 can be formed as illustrated in FIG. 10.

Figure 14:
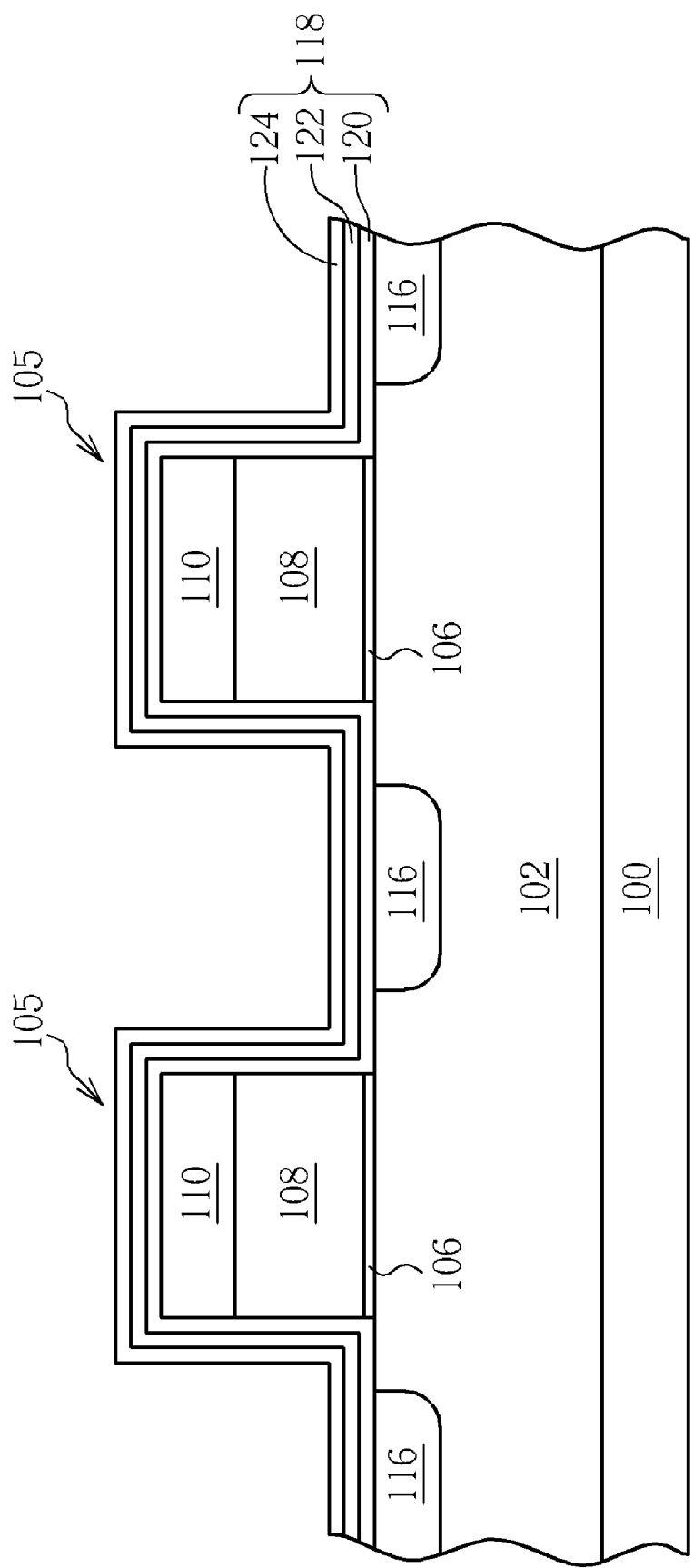
FIG. 14 and FIG. 15 show an alterative in the method of forming a split-gate memory according to the present invention.
Figure 15:
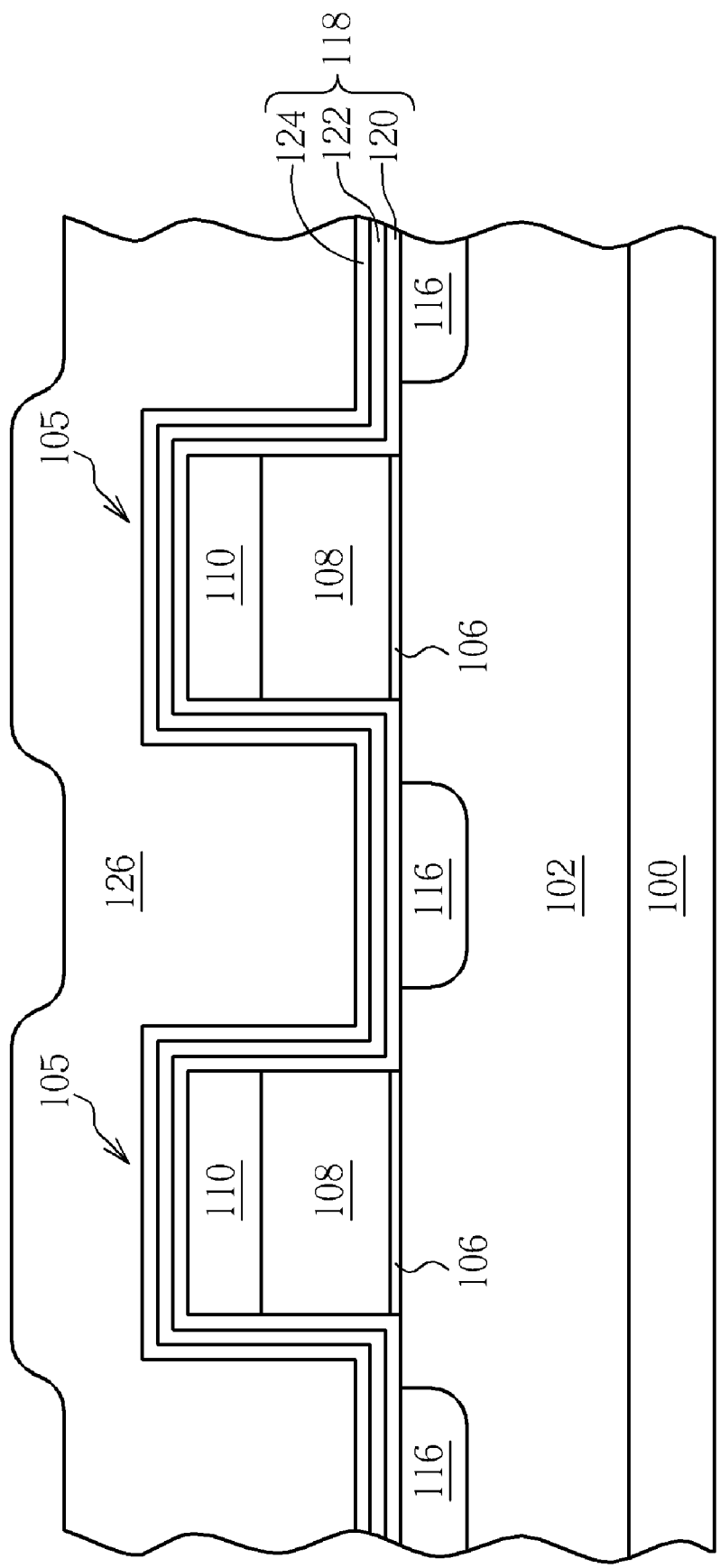
Figure 16:
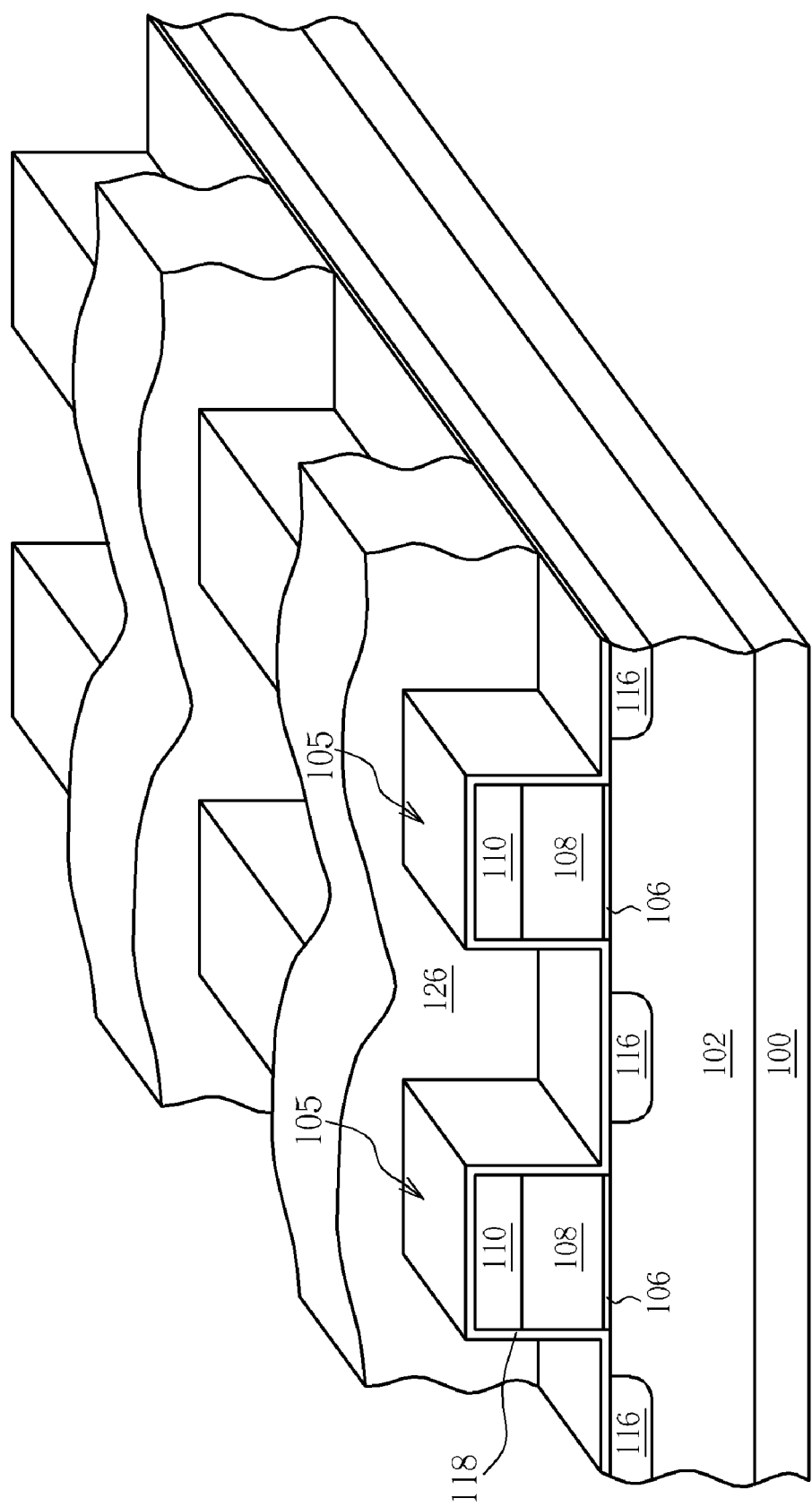
FIG. 16 is a schematic diagram illustrating an external view of a split-gate memory accomplished in an embodiment according to the present invention.

It is still to be noted that it is not necessary to remove the cap layer 110 in the case that it is a dielectric material or a conductive material. A composite dielectric layer 118 can be formed on the semiconductor substrate 100, the select gate structures 105 including the cap layers 110 and the polysilicon layers 108, and the N doped regions 116, for being a storage medium of electrons, as shown in FIG. 14. Finally, a conductive layer (not shown) is entirely deposited on the composite dielectric layer 118 and defined as a plurality of parallel word lines 126, which are perpendicular to the select gate structures 105, as shown in FIG. 15. FIG. 16 schematically shows an external view of a split-gate memory accomplished in an embodiment according to the present invention.

As noted that, according to the method of the present invention, the cap layers optionally comprise a single layer or a plurality of layers as desired. The variation may depend on the adhesion to the underlying conductive layer or the resistance to the particle impact.

As described, according to the method of the present invention, the doped regions are formed in the substrate before forming the composite dielectric layer. Consequently, the composite dielectric layer is not damaged, and therefore possesses good electron capturing abilities. On the other hand, according to the conventional method, the doped regions are formed after forming the composite dielectric layer. This forces the conventional method to form a blocking film to avoid the short circuit between the buried bit lines and the word lines. However, since the composite dielectric layer has been damaged when forming the openings, the split-gate SONOS memory fabricated by the conventional method suffers from an unstable programming voltage or erasing voltage. This seriously affects the reliability.

Furthermore, according to the method of the present invention as described, an excellent ratio of line width to space width (W/S) can be obtained and an improved channel length is attained without using sacrificed spacers, therefore it is simpler than conventional methods in which sacrificed spacers must be used and then removed. Accordingly, the method according to the present invention is very suitable as a sub-90 nm split-gate SONOS technique with high density.

Figure 17:
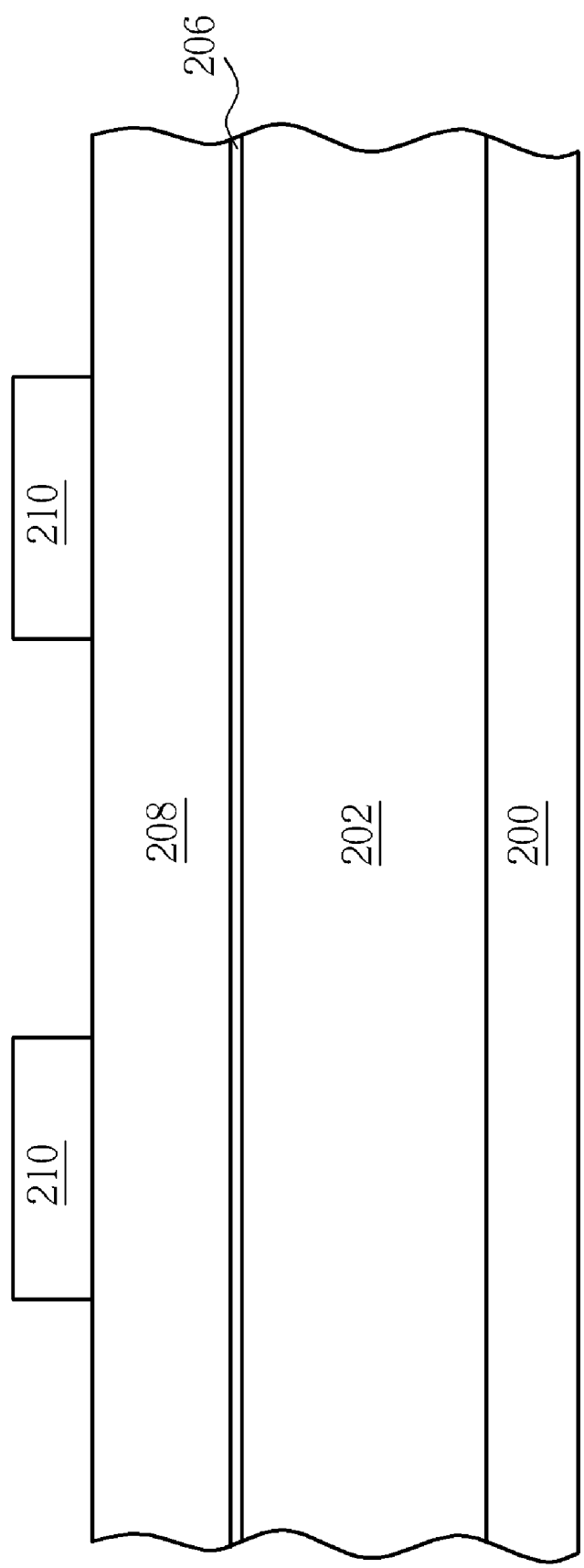
FIG. 17 to FIG. 25 are schematic diagrams illustrating a method of forming a split-gate memory according to still another embodiment of the present invention.

Another aspect of the present invention is described as follows. FIG. 17 to FIG. 25 are schematic diagrams illustrating a method of forming a split-gate flash memory according to another preferred embodiment of the present invention. It is to be appreciated that for emphasizing the defining characteristic of the present invention, FIG. 17 to FIG. 25 are cross-sectional views of some memory cells. As shown in FIG. 17, a semiconductor substrate 200 is provided, and at least a P well 202 is formed in the semiconductor substrate 200. The semiconductor substrate may be a P-type semiconductor substrate. Then, a gate insulating layer 206, a conductive layer 208, and a dielectric layer (not shown) are formed in the order of bottom to top on the semiconductor substrate 200. The dielectric layer may be a silicon oxide layer formed by chemical vapor deposition (CVD). The dielectric layer is then patterned to form a plurality of parallel three-dimensional trip structures 210.

Figure 18:
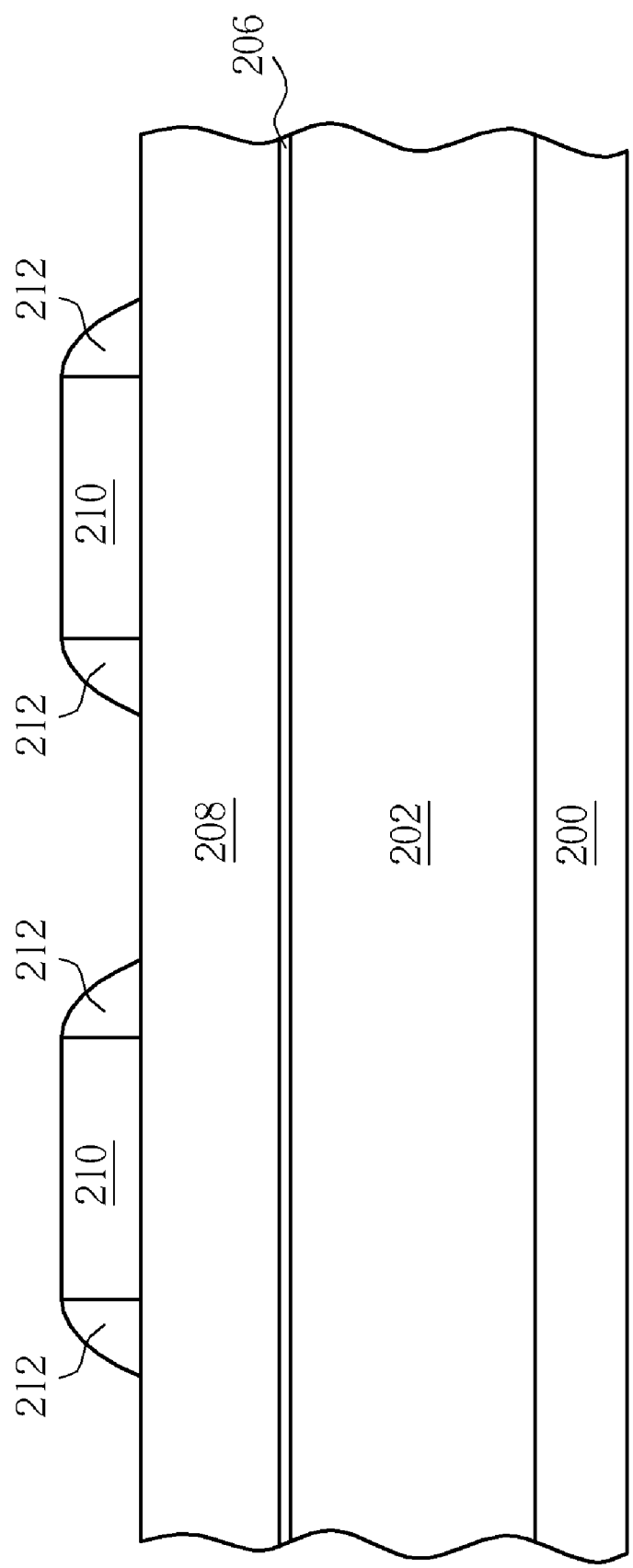

As shown in FIG. 18, a silicon nitride layer is entirely deposited on the conductive layer 208 and the three-dimensional trip structures 210 by CVD, and then is entirely etched back for forming spacers 212 alongside each three-dimensional trip structure 210 and exposing part of the conductive layer 208 between any two adjacent spacers 212. Thereafter, the etching for the conductive layer 208 is performed to remove part of the conductive layer not covered by the spacers 212 and the three-dimensional trip structures 210. The remaining part of the conductive layer forms a plurality of strip structures 208b and part of the gate insulating layer is exposed, thus an opening 214 is formed, as shown in FIG. 19.

Figure 20:
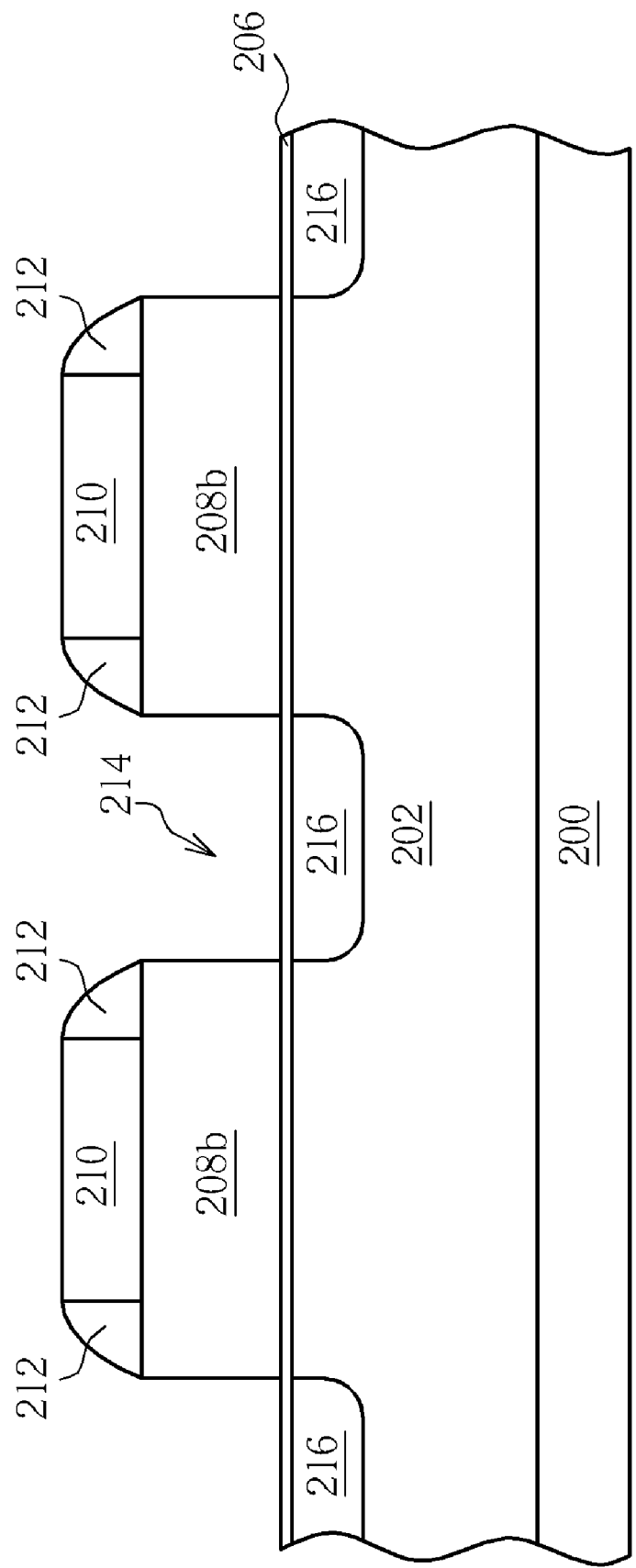
Figure 21:
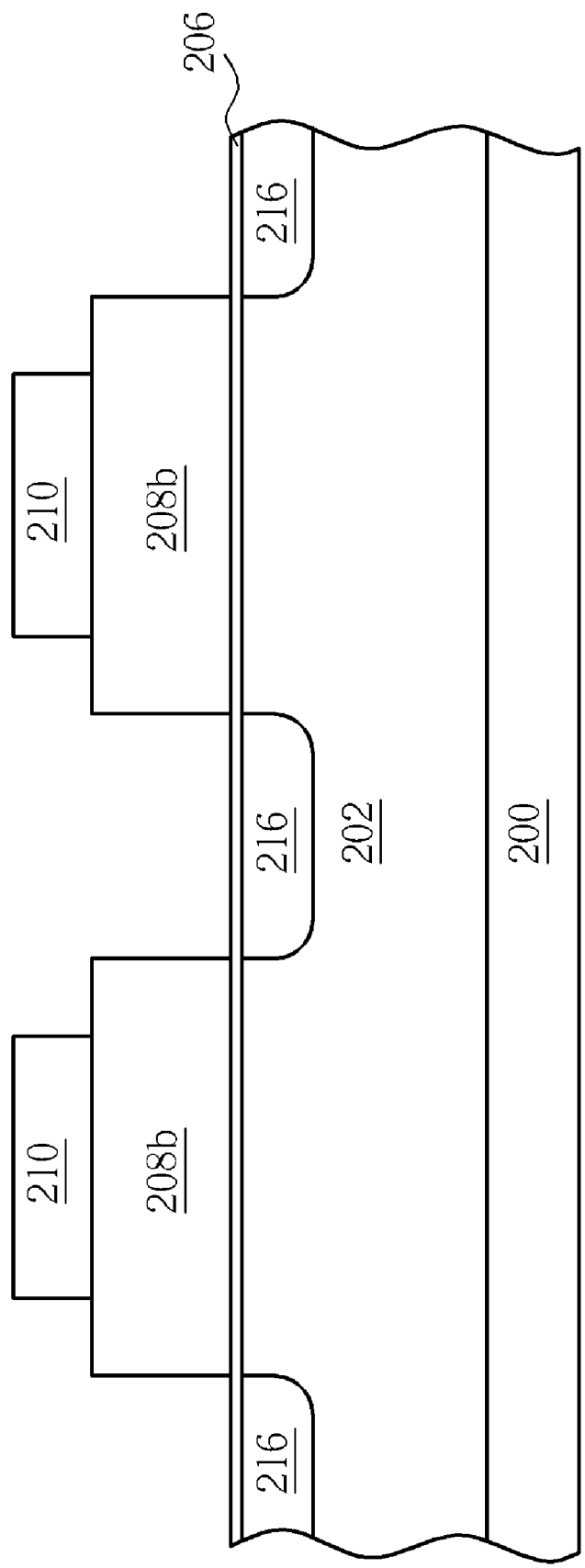

Please refer to FIG. 20. An ion implantation process is performed to form an N doped region 216, which serves as a buried bit line, in each P well 202 via each opening 214 using the spacers 212 and the three-dimensional trip structures 210 as a mask. Referring to FIG. 21, the spacers 212 are removed by etching, and a result similar to the cap layers after trimming process as shown in FIG. 12 is attained.

Figure 19:
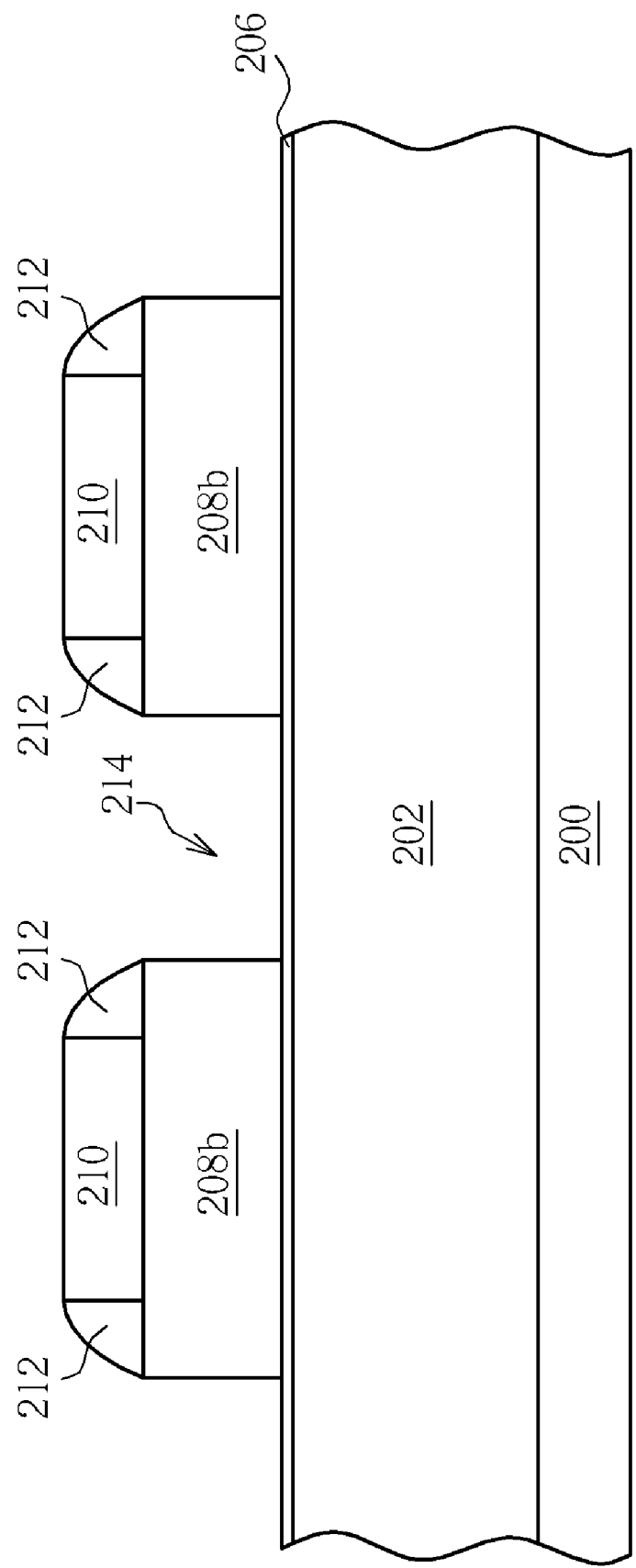
Figure 22:
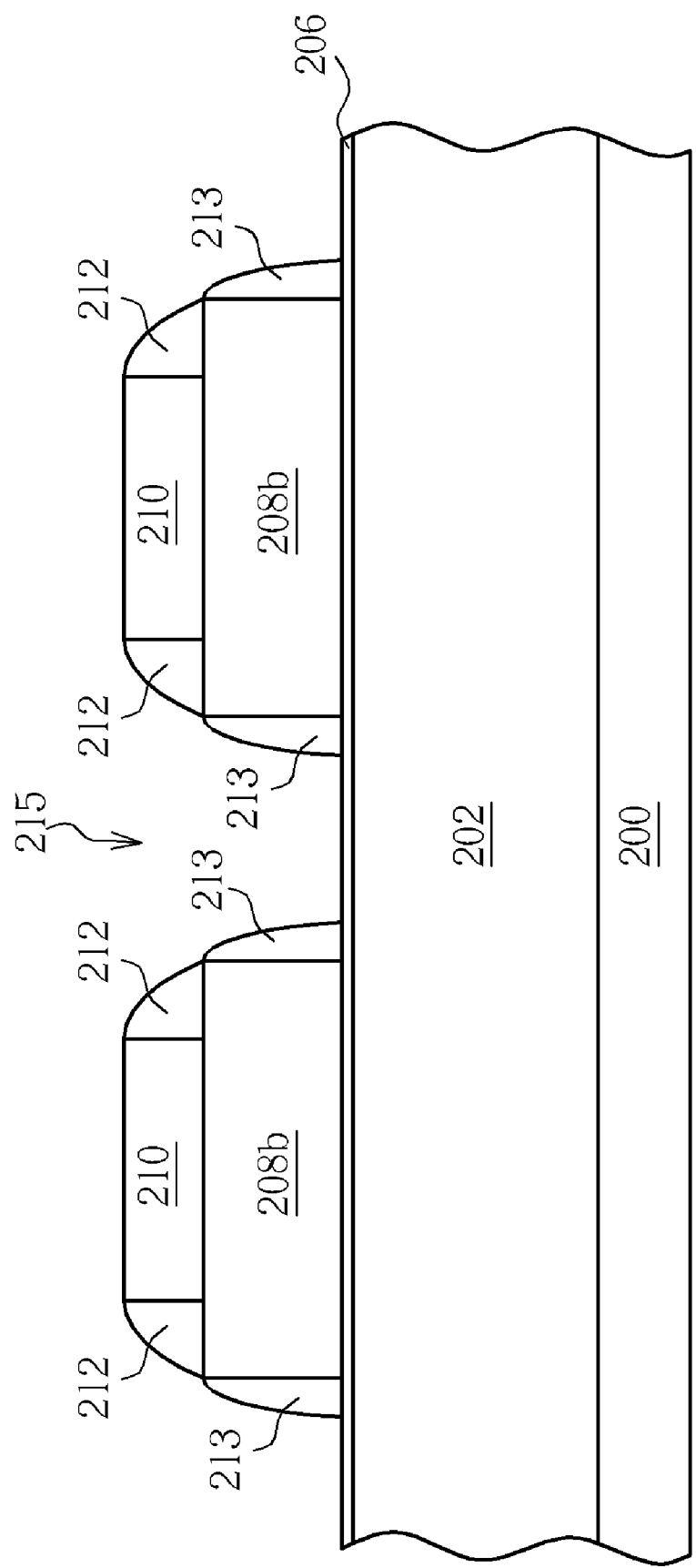
Figure 23:
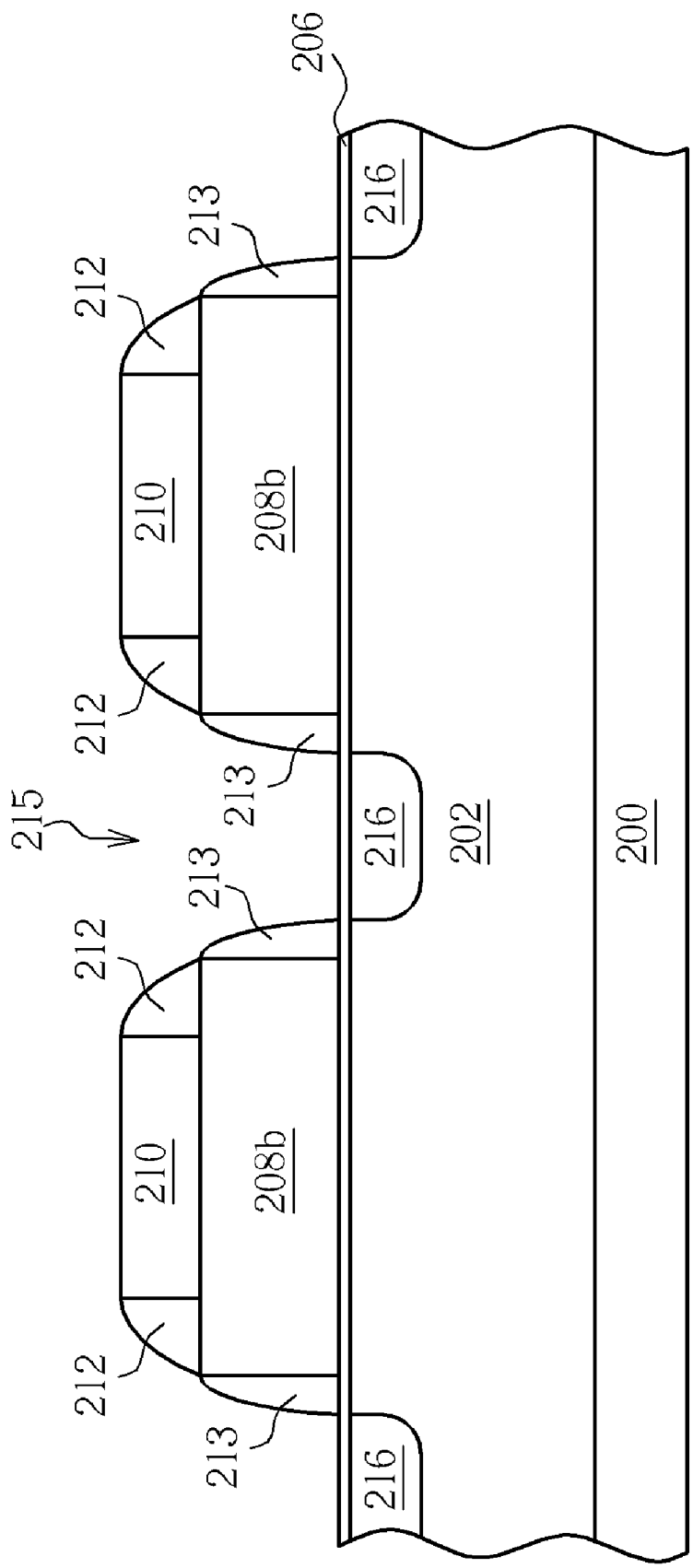

Alternatively, after the formation of spacers 212 and a plurality of conductive layer strip structures 208b as shown in FIG. 19, a silicon oxide layer (not shown) is entirely deposited on the conductive layer strip structures 208b, the spacers 212, and the three-dimensional trip structures 210 by, for example, CVD. Then, an etching back process is performed to etch the silicon oxide layer until spacers 213 alongside each conductive layer strip structure 208b are formed and part of the gate insulating layer 206 between any two adjacent spacers 213 is exposed, forming an opening 215, as shown in FIG. 22. Subsequently, referring to FIG. 23, an ion implantation process is performed to form an N doped region 216, which serves as a buried bit line, in each P well 202 via each opening 215 using the spacers 212, 213, and the three-dimensional trip structures 210 as a mask. An oxidation process may be optionally performed on the doped regions to increase the resistance to the programming/erasing voltage for the composite dielectric layer (ONO layer) subsequently formed. Thereafter, referring to FIG. 24, the spacers 212 and 213 are removed by etching, and a result similar to the cap layers 110 after trimming process as shown in FIG. 12 is attained. Alternatively, in case the spacers 213 are made of the same material as the conductive layer, it is not necessary to remove them with the spacers 212 together, and the spacers 213 can be removed later when the conductive layer strip structures 208b are etched in the subsequent step.

Figure 24:
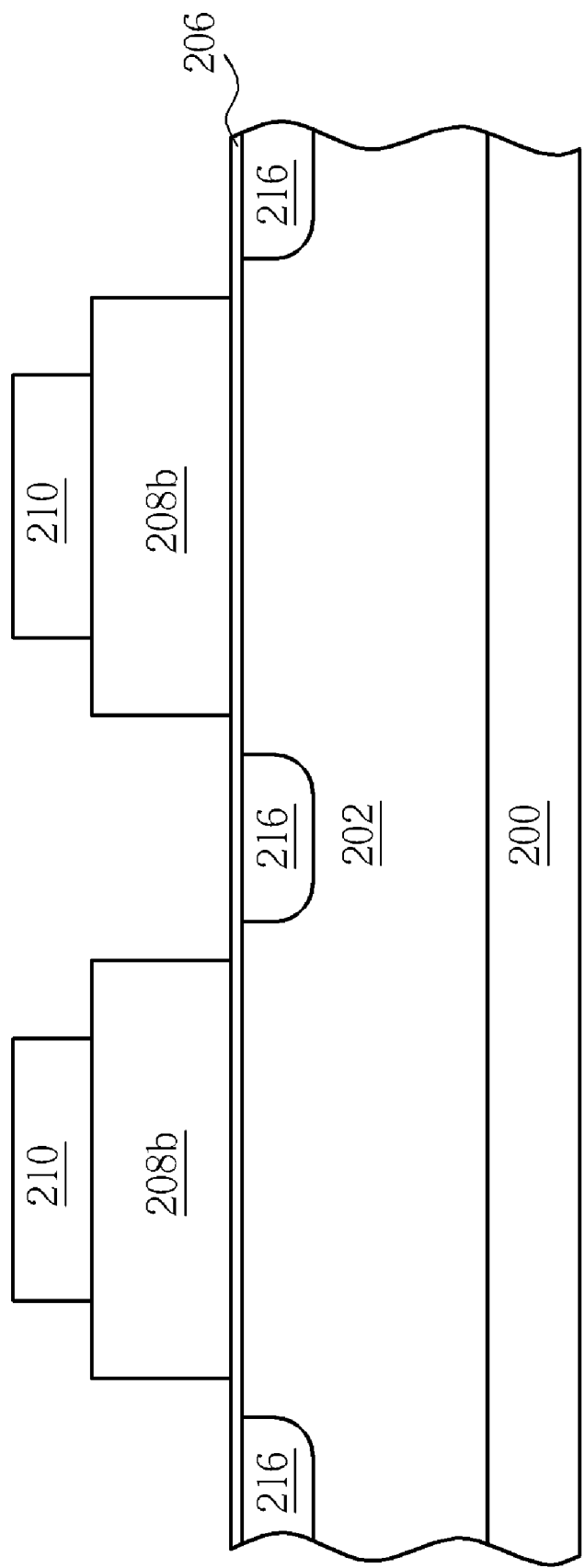
Figure 25:
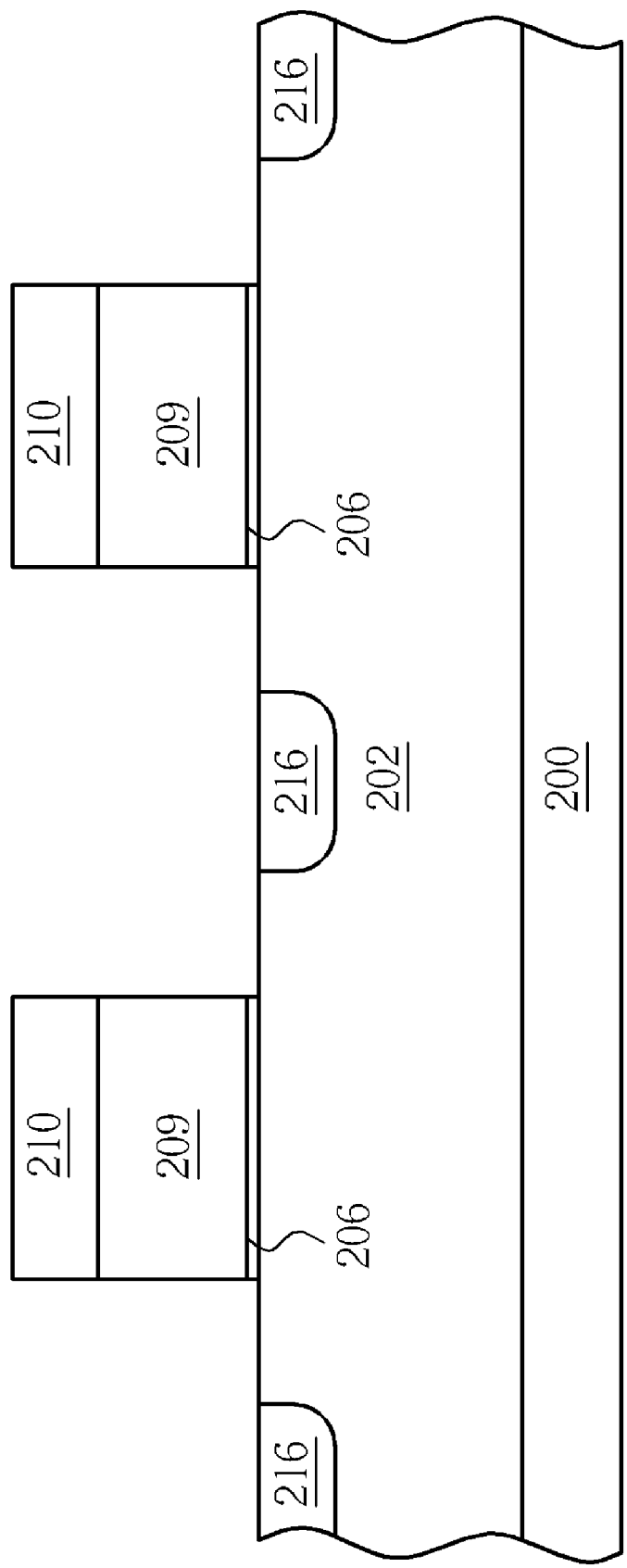

In the embodiments shown in FIGS. 21 and 24, an etching process is needed to perform on the conductive layer strip structures 208b to remove the part not covered by the three-dimensional trip structures 210. Thus, an anisotropic etching, such as dry etching process, may be performed using the three-dimensional trip structures 210 as a mask, forming select gate structures 209, as shown in FIG. 25. Thereafter, a composite dielectric layer (not shown) can be formed on the semiconductor substrate 200, the select gate structures 209, the three-dimensional trip structures 210 formed from the dielectric layer, and the N doped regions 216, for being a storage medium of electrons, similar to that shown in FIG. 14. Finally, similar to that in FIG. 15, a conductive layer (not shown) is entirely deposited on the composite dielectric layer and defined as a plurality of parallel word lines, which are perpendicular to the select gate structures 105, accomplishing the formation of a split-gate flash memory.

It is noted that, in method of the present invention, the conductive layer, the dielectric layer, and the spacers used preferably have different etching rates to offer the proper etching selectivity for structure removal needed in the etching processes. For example, the method of the present invention is favored by using a conductive layer of polysilicon, a dielectric layer of silicon oxide, and spacers of silicon nitride.

A split-gate flash memory obtained from an embodiment according to the present invention has a line width of 0.18 µm and a space width of 0.4 µm for select gate structures, the doped region width of 0.1 µm, a select gate channel length of 0.18 µm in the case that the diffusion distance for the dopants in the doped region is 75 nm, and control gate channel length of 75 nm. Therefore, the ratio of line width to space width for the dielectric layer in the photography in the manufacture for a split-gate flash memory is improved using the method of the present invention and, in turn, a good ratio of line width to space width for select gate structures is obtained, which is more favorable for the high density split-gate SONOS technique.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a split-gate flash memory, comprising:
providing a semiconductor substrate having a plurality of conductive lines arranged in parallel and positioned on the semiconductor substrate;
performing an implantation process by utilizing the conductive lines as a mask to form a doped region in the semiconductor substrate between two adjacent conductive lines;
performing a trimming process to trim a shielding area of each conductive line on the semiconductor substrate;
forming a composite dielectric layer on the semiconductor substrate and covering the conductive lines; and
forming a plurality of word lines on the composite dielectric layer perpendicular to the conductive lines.

2. The method of claim 1, wherein a gate insulating layer is positioned between the conductive lines and the semiconductor substrate, and the conductive lines serve as select gate structures after performing the trimming process.

3. The method of claim 1, wherein the trimming process is an isotropic etching process to reduce the shielding area of each conductive line on the semiconductor substrate.

4. The method of claim 3, wherein each conductive line is a polysilicon layer.

5. The method of claim 1, wherein each conductive line from bottom to top comprises a polysilicon layer and a cap layer.

6. The method of claim 5, wherein the trimming process comprises the steps of:
isotropically etching the cap layer to reduce the shielding area of each cap layer over each polysilicon layer; and
isotropically etching the polysilicon layer using the cap layer after the step of isotropically etching as a mask.

7. The method of claim 6, wherein after isotropically etching the polysilicon layer, the trimming process further comprises a step of removing the cap layer.

8. The method of claim 6, wherein each cap layer comprises photoresist, dielectric material, or conductive material.

9. The method of claim 1, wherein the doped regions serve as buried bit lines.

10. The method of claim 1, wherein the composite dielectric layer comprises a silicon oxide-silicon nitride-silicon oxide (ONO) tri-layer dielectric.

11. The method of claim 1, wherein the semiconductor substrate comprises a P-type semiconductor substrate.

12. The method of claim 11, wherein each doped region comprises an N doped region.

13. A method of forming a split-gate flash memory, comprising:
providing a semiconductor substrate having a gate insulating layer, a conductive layer, and a dielectric layer formed in the order of bottom to top on the semiconductor substrate;
etching the dielectric layer so that the dielectric layer forms a plurality of parallel three-dimensional strip structures;
forming a first spacer respectively positioned on the opposite side walls of the three-dimensional strip structures;
etching part of the conductive layer not covered by the three-dimensional strip structures and the first spacers to expose part of the gate insulating layer;

performing an implantation process by utilizing the three-dimensional strip structures and the first spacers as a mask to form a plurality of doped regions in the semiconductor substrate;

removing the first spacers;

etching part of the conductive layer not covered by three-dimensional strip structures to form a plurality of select gate structures;

forming a composite dielectric layer on the semiconductor substrate and covering the three-dimensional strip structures and the select gate structure; and forming a plurality of word lines on the composite dielectric layer perpendicular to the conductive lines.

14. The method of claim 13, after the step of forming the first spacers and before the step of performing an implantation process, further comprising:

forming a second spacer respectively positioned on the opposite side walls of the conductive layers exposed after being etched; and removing the second spacers when the first spacers are removed.

15. The method of claim 13, wherein the conductive layer comprises polysilicon.

16. The method of claim 13, wherein the doped regions serve as buried bit lines.

17. The method of claim 13, wherein the composite dielectric layer comprises a silicon oxide-silicon nitride-silicon oxide (ONO) tri-layer dielectric.

18. The method of claim 13, wherein the semiconductor substrate comprises a P-type semiconductor substrate.

19. The method of claim 13, wherein each doped region comprises an N doped region.

20. The method of claim 13, wherein the conductive layer, the dielectric layer, and the spacers have different etching rates.

* * * * *